United States Patent
Oneufer et al.

(10) Patent No.: US 9,888,589 B2
(45) Date of Patent: *Feb. 6, 2018

(54) BUCKET ASSEMBLIES FOR MOTOR CONTROL CENTERS AND RELATED MOTOR CONTROL CENTERS

(71) Applicant: Eaton Corporation, Cleveland, OH (US)

(72) Inventors: Stephen William Oneufer, Fayetteville, NC (US); Daniel Boyd Kroushl, Clayton, NC (US); Robert Allan Morris, Fayetteville, NC (US)

(73) Assignee: Eaton Corporation, Cleveland, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/240,723

(22) Filed: Aug. 18, 2016

(65) Prior Publication Data

US 2016/0360626 A1   Dec. 8, 2016

Related U.S. Application Data

(63) Continuation of application No. 14/600,616, filed on Jan. 20, 2015, now Pat. No. 9,451,718, which is a
(Continued)

(51) Int. Cl.
*H02B 1/38* (2006.01)
*H05K 5/02* (2006.01)
(Continued)

(52) U.S. Cl.
CPC ......... *H05K 5/0017* (2013.01); *A47B 46/005* (2013.01); *A47B 81/00* (2013.01); *H02B 1/36* (2013.01); *H05K 5/023* (2013.01); *H05K 5/0208* (2013.01); *H05K 5/0217* (2013.01); *H05K 5/0226* (2013.01); *H05K 5/0239* (2013.01); *H05K 5/0247* (2013.01); *H05K 7/16* (2013.01); *H02B 1/38* (2013.01); *H02B 11/24* (2013.01)

(58) Field of Classification Search
CPC ........... H02B 1/36; H02B 1/38; H05K 5/0239
See application file for complete search history.

(56) References Cited

U.S. PATENT DOCUMENTS 1,838,898 A   12/1931   Aldeen
2,042,886 A   6/1936   Ferguson
(Continued)

FOREIGN PATENT DOCUMENTS

FR   2747877   10/1997
FR   2814321   3/2002

OTHER PUBLICATIONS

Arc-flash—the treat that is real, Freedom Arc Resistant Motor Control Center, product brochure, EATON, Mar. 2014, 2 pages.
(Continued)

*Primary Examiner* — Robert J Hoffberg
(74) *Attorney, Agent, or Firm* — Myers Bigel, P.A.

(57) ABSTRACT

Motor control centers have units or bucket assemblies with a front panel configured to pivot about a long axis associated with a bottom long side thereof and slide radially with respect to the shaft, away from the shaft in an open position to thereby position the front panel a distance away from the shaft to be able to fully open to at least ninety degrees.

20 Claims, 19 Drawing Sheets

Related U.S. Application Data continuation-in-part of application No. 14/318,971, filed on Jun. 30, 2014, now Pat. No. 9,531,169.

(51) Int. Cl.
| | |
|---|---|
| *H05K 5/00* | (2006.01) |
| *A47B 46/00* | (2006.01) |
| *A47B 81/00* | (2006.01) |
| *H02B 1/36* | (2006.01) |
| *H05K 7/16* | (2006.01) |
| *H02B 11/24* | (2006.01) |

(56) References Cited

U.S. PATENT DOCUMENTS

| | | | |
|---|---|---|---|
| 2,809,085 A | 10/1957 | Fall | |
| 2,914,707 A | 11/1959 | Timmerman | |
| 2,921,998 A | 1/1960 | Pokorny et al. | |
| 3,203,575 A | 8/1965 | Anderson et al. | |
| 3,479,104 A | 11/1969 | Kobryner | |
| 4,024,441 A | 5/1977 | Coyle et al. | |
| 4,086,452 A | 4/1978 | Collins | |
| 4,090,230 A | 5/1978 | Fuller et al. | |
| 4,206,944 A | 6/1980 | Kumagai et al. | |
| 4,371,223 A | 2/1983 | Grunert et al. | |
| 4,486,815 A | 12/1984 | Takahashi | |
| 4,503,408 A | 3/1985 | Mrenna et al. | |
| 4,754,367 A | 6/1988 | Bohnen | |
| 4,926,286 A | 5/1990 | Maki et al. | |
| 5,343,355 A | 8/1994 | Ishikawa | |
| 5,625,531 A * | 4/1997 | Padilla | H02B 1/26 |
| | | | 361/623 |
| 5,910,760 A | 6/1999 | Malingowski et al. | |
| 6,031,192 A | 2/2000 | Liebetruth | |
| 6,194,983 B1 | 2/2001 | Bogdon et al. | |
| 6,711,001 B2 | 3/2004 | Hernandez et al. | |
| 7,186,933 B2 | 3/2007 | Turner | |
| 7,420,133 B2 | 9/2008 | Farrow et al. | |
| 7,684,199 B2 | 3/2010 | Yee et al. | |
| 7,688,572 B2 | 3/2010 | Yee et al. | |
| 7,800,888 B2 | 9/2010 | Morris et al. | |
| 7,965,493 B2 | 6/2011 | Leeman et al. | |
| 7,987,555 B2 | 8/2011 | Chen et al. | |
| 8,108,971 B2 | 2/2012 | Florek | |
| 8,199,022 B2 | 6/2012 | Morris et al. | |
| 8,243,422 B2 | 8/2012 | Leeman et al. | |
| 8,248,761 B2 | 8/2012 | Leeman et al. | |
| 8,305,736 B2 | 11/2012 | Yee et al. | |
| 8,511,510 B2 | 8/2013 | Pratte et al. | |
| 8,537,518 B2 | 9/2013 | Morris et al. | |
| 8,590,106 B2 | 11/2013 | Lu | |
| 8,817,454 B2 | 8/2014 | Morris et al. | |
| 8,934,218 B2 | 1/2015 | Morris | |
| 9,153,947 B2 | 10/2015 | Fleitmann et al. | |
| 9,451,718 B2 * | 9/2016 | Oneufer | H02B 1/36 |
| 9,531,169 B2 * | 12/2016 | Oneufer | H02B 1/46 |
| 2008/0022673 A1 | 1/2008 | Morris et al. | |
| 2008/0023211 A1 | 1/2008 | Yee et al. | |
| 2008/0258667 A1 | 10/2008 | Morris et al. | |
| 2009/0086414 A1 | 4/2009 | Yee et al. | |
| 2013/0077210 A1 | 3/2013 | Morris | |
| 2013/0088812 A1 | 4/2013 | Yee et al. | |
| 2014/0362498 A1 | 12/2014 | Morris et al. | |
| 2015/0103472 A1 | 4/2015 | Oneufer et al. | |
| 2015/0221458 A1 | 8/2015 | Oneufer et al. | |
| 2015/0380910 A1 | 12/2015 | Oneufer et al. | |
| 2015/0382492 A1 | 12/2015 | Oneufer et al. | |
| 2017/0063056 A1 * | 3/2017 | Oneufer | H02B 1/46 |

OTHER PUBLICATIONS

International Search Report and Written Opinion for related PCT Application No. PCT/IB2015/054356, dated Aug. 19, 2015, 11 pages.

Invitation to Pay Additional Fees for related PCT Application No. PCT/IB2015/054356, dated Aug. 19, 2015, 6 pages.

Drawings/Views of internal components of an MCC (FLASHGARD) unit sold by Eaton, Inc. at least as early as 2012 (6 pages), No date.

International Search Report and the Written Opinion of the International Searching Authority corresponding to International Patent Application No. PCT/IB2015/054355 (17 pages) (dated Oct. 26, 2015).

* cited by examiner

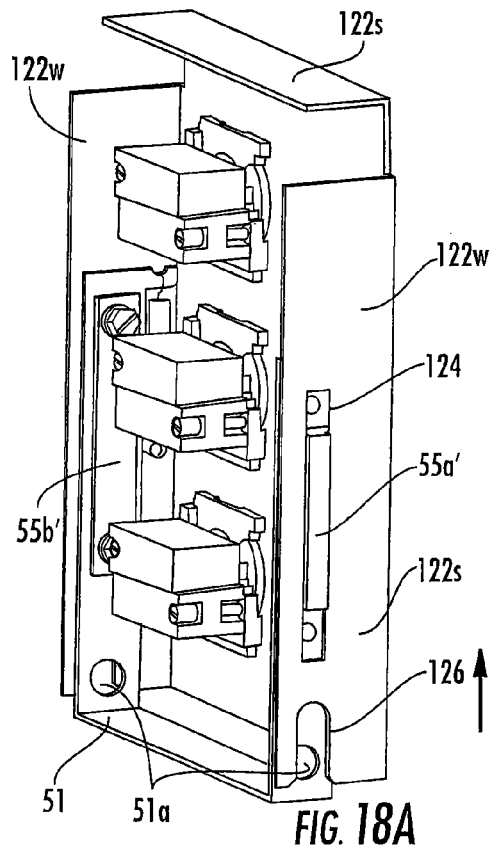
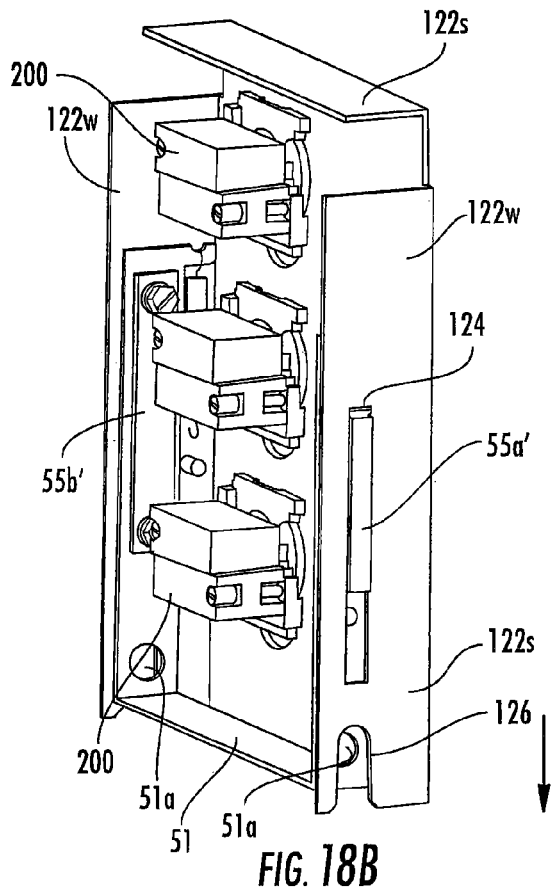
FIG. 18A
FIG. 18B
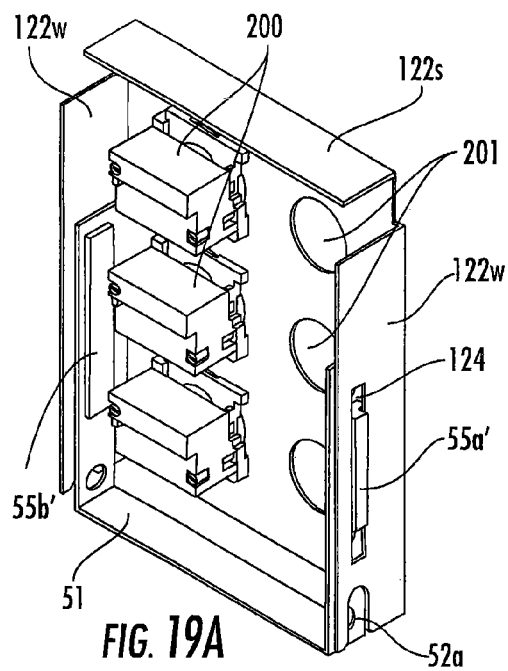
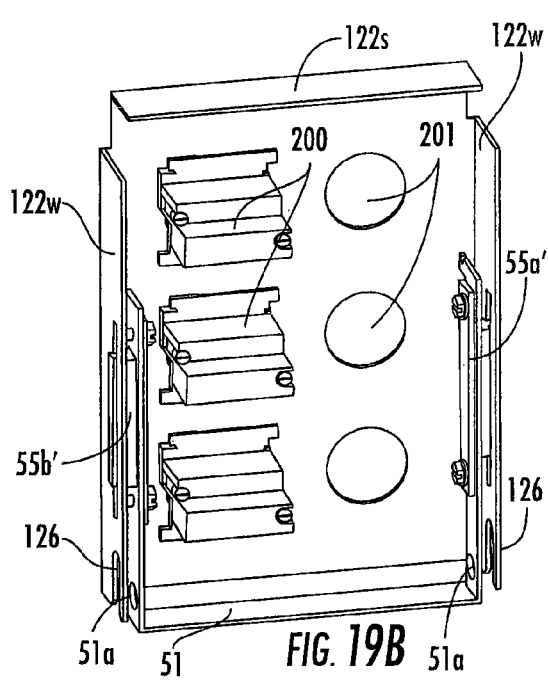
FIG. 19A
FIG. 19B

BUCKET ASSEMBLIES FOR MOTOR CONTROL CENTERS AND RELATED MOTOR CONTROL CENTERS

RELATED APPLICATIONS

This application is a continuation application of U.S. patent application Ser. No. 14/600,616, now issued as U.S. Pat. No. 9,451,318, filed Jan. 20, 2015, which is a continuation-in-part of U.S. patent application Ser. No. 14/318,971, filed Jun. 30, 2014, which published as U.S. Patent Application Publication Number U.S. 2015/0380910, the contents of which are hereby incorporated by reference as if recited in full.

FIELD OF THE INVENTION

The present invention relates to motor control systems and more particularly to motor control center units.

BACKGROUND OF THE INVENTION

As is known to those of skill in the art, Motor Control Centers (MCC) can include cabinets or enclosures that hold multiple, typically modular, bucket assemblies of various sizes. See, e.g., U.S. Pat. No. 4,024,441, the contents of which are hereby incorporated by reference as if recited in full herein. Eaton Corporation has recently introduced a MCC product line with compact bucket assemblies that conveniently plug into a slot or space in an MCC cabinet. The product is sold under the product name, Freedom 2100 MCC. See also, U.S. Patent Application Publication Number US2013/0077210, the contents of which are hereby incorporated by reference as if recited in full herein.

Motor control centers are used, for example, in some commercial and industrial applications to distribute electrical power to a variety of loads (e.g., without limitation, relatively high power electrical motors, pumps, and other loads).

The bucket assemblies (also known as "buckets" or "units") can include operating handles that are disposed on the front door. The handle can be a rotary handle configured to convert the rotary motion of the rotary handle to the linear or translational motion of a circuit breaker linear action lever. See, e.g., U.S. Pat. Nos. 6,194,983 and 7,186,933, the contents of which are incorporated by reference as if recited in full herein. The handle is typically mounted parallel with the plane of the faceplate of the molded case circuit breaker, but spaced outwardly from it by the depth of the handle mechanism. Usually, a series of linkages are utilized to interconnect the rotary motion of the rotary handle to the linear motion of the circuit breaker handle or lever.

FIG. 1, for example, shows a portion of a prior art motor control center 100. The motor control center 100 includes a multi-compartment enclosure 12 for receiving a plurality of motor control units 10. Typically, each bucket 10 is a removable, pull-out unit that has a respective door 22 (which may be under a front panel). The door 22 is typically coupled to the housing 12 by hinges 28 (shown in phantom line drawing in FIG. 1) to permit access to motor control components of the bucket 10 while it is installed in the enclosure 12. For example and without limitation, the door 22 permits access to a circuit breaker assembly, a stab indicator 32, a shutter indicator 34, and a line contact actuator 36. In the past conventional device panels were not used in favor of a membrane printed circuit panel 30.

When the bucket 10 is fully installed and electrically connected, a user-operator may operate a so-called handle operator or disconnect handle 20h. In a de-energized state of the motor control center 100, the user-operator may operate an isolation feature by moving a slide 140 and inserting crank 42 through an access portal or hole 43 in the door 22 to access the line contact actuator 36 to move a number of line contacts (see, for example, stab contacts 46,48,50 of the prior art bucket 10 of FIG. 2) to an isolated position out of (see FIG. 2) electrical contact with power lines or buses 1152 (partially shown in phantom line drawing in FIG. 2) of the motor control center 100. Motor control centers and units therefore (also sometimes called "subunits") are described in greater detail, for example, in commonly assigned U.S. Patent Application Publications 2009/0086414, 2008/0258667, 2008/0023211 and 2008/0022673, which are hereby incorporated herein by reference.

Despite the above, there remains a need for alternate bucket configurations.

SUMMARY OF EMBODIMENTS OF THE INVENTION

Embodiments of the invention are directed to buckets/units with telescoping and pivotable front panels that allow access to interior components for maintenance, trouble shooting, service and/or repair and the like.

The buckets/units can include a front panel holding at least one operator disconnect handle. The front panel can be a single panel or side-by-side dual sub-panels that are detachable (releasably attached) along inner short sides thereof to be able to pivot outward together. The single panel or dual sub-panels can be pivotably attached to a unit housing to pivot and telescopingly extend a distance outward.

The front panel can be a single panel that extends between the sidewalls.

The front panel can be configured as two adjacent sub-panels that are attached at inner sides thereof to be able to pivot outwardly in concert along the long axis.

Embodiments of the invention are directed to a bucket assembly that includes a housing, a telescoping hinge assembly with at least one shaft attached to the housing, and a panel or at least one sub-panel holding at least one handle operator and/or pilot devices pivotably attached to the telescoping hinge assembly so that the panel or sub-panel is configured to (i) pivot about the at least one shaft to swing open from a closed position and (ii) slide outward in a direction away from the at least one shaft.

The panel or at least one sub-panel can include opposing right and left sidewalls oriented in a plane that is orthogonal to a front facing primary wall of the panel or at least one sub-panel. The at least one shaft can include or be a laterally extending shaft that resides along a bottom portion of the housing attached to opposing, laterally spaced apart housing sidewalls. The telescoping hinge assembly can also include slide arms that slide in longitudinally extending slots in or co-planar with the panel or respective sub-panel sidewall planes to allow the panel or sub-panel to slide in a radial direction relative to the at least one shaft outward away from the laterally extending shaft to open and back toward the laterally extending shaft to the closed position.

The at least one shaft is a single laterally extending shaft that resides along a bottom portion of the housing. The telescoping hinge assembly can include a support member attached to the laterally extending shaft. The support member can include laterally spaced apart side segments that cooperate with the panel or at least one sub-panel, arranged so that, in the closed position, the support member side segments extend upwardly away from the laterally extending shaft.

The panel or sub-panel can include a front wall and opposing right and left sidewalls oriented in planes that are parallel to each other and orthogonal to the front wall of the panel or sub-panel. The telescoping hinge assembly can include a support member with a laterally extending segment spanning between right and left upwardly extending side segments. The right and left upwardly extending side segments can be co-planar to corresponding planes of the right and left sidewalls of the panel or sub-panels.

The hinge assembly can include right and left springs that extend in a longitudinal direction. The right spring can be attached to the right sidewall of the panel or a respective sub-panel and the right upwardly extending side segment of the support member. The left spring can be attached to the left sidewall of the panel or respective sub-panel and the left upwardly extending side segment of the support member. The springs can bias the panel or respective sub-panel in a latched position whereby the springs that attach the panel or at least one sub-panel to the housing bias the panel or sub-panel in a latched position so the panel or sub-panel remains secured to the housing unless there is a manual action by a user to pull the panel or sub-panel down to open the panel or sub-panel.

The hinge assembly can include right and left slide arms that slidably travel back and forth in longitudinally extending slots in or co-planar with a corresponding right and left sidewall plane of the panel or respective sub-panel.

The at least one shaft can include a laterally extending shaft that resides along a bottom portion of the housing attached to opposing, laterally spaced apart housing sidewalls. The panel or at least one sub-panel can include opposing right and left sidewalls oriented in planes that are parallel to each other and orthogonal to a front facing wall of the panel or at least one sub-panel. A bottom of the right and left sidewalls of the panel or at least one sub-panel can have an open channel sized and configured to slidably receive the shaft when in the closed position. The open channel can have an arcuate closed end located a distance away from an open end of the open channel.

The at least one shaft can include a laterally extending shaft attached to the housing. The panel or at least one sub-panel can be configured as dual adjacently positioned sub-panels with flat front surfaces with the dual sub-panels configured as a handle operator panel and a pilot device panel. The pilot device panel and the handle operator panel can be metallic. The pilot device panel can be in abutting contact with the laterally extending shaft when in the closed position to define an electrical ground for pilot devices held by the pilot panel.

The panel or at least one sub-panel can be side-by-side dual sub-panels that are releasably attached along inner facing adjacent sides to be able to pivot outward together or separately. The sub-panels can engage at least one unit interlock attached to the unit housing to controllably lock and unlock the sub-panels to allow the sub-panels to open from the unit housing only when there is non-conduction.

In some embodiments, a motor control center (MCC) includes one or more of the the bucket assemblies described hereinabove. The panel or at least one sub-panel can be metal, typically steel.

Other embodiments are directed to bucket assemblies that include a housing, a hinge assembly with a shaft attached to the housing and a support member configured to pivot about the shaft; and a panel or at least one sub-panel attached to the support member and configured to slide radially with respect to the shaft to thereby pivot about the at least one shaft and slide outward in a direction away from the at least one shaft to open from a closed position to an open position.

The panel or at least one sub-panel can hold at least one handle operator and/or pilot devices attached to the telescoping hinge assembly so that the panel or sub-panel is configured to The panel or at least one sub-panel can include opposing right and left sidewalls oriented in planes that are parallel to each other and orthogonal to a front facing primary wall of the panel or at least one sub-panel. The shaft can be a laterally extending shaft that resides along a bottom portion of the housing attached to opposing, laterally spaced apart housing sidewalls. The hinge assembly support member can include slide arms that slide in longitudinally extending slots that are in or co-planar to the right and left sidewalls to allow the panel or at least one sub-panel to slide outward in the direction away from the shaft to open and back toward the shaft to the closed position.

The shaft can be a single laterally extending shaft that resides along a bottom portion of the housing.

The hinge assembly support member can include a frame attached to the laterally extending shaft. The frame can include laterally spaced apart side segments that cooperate with the panel or at least one sub-panel, arranged so that, in the closed position, the frame side segments extend upwardly away from the laterally extending shaft.

The panel or sub-panel can include a front wall and opposing right and left sidewalls oriented in planes that are parallel to each other and orthogonal to the front wall of the panel or sub-panel. The hinge assembly support member can include a frame with a laterally extending segment spanning between right and left upwardly extending side segments. The right and left upwardly extending side segments can be co-planar to respective right and left sidewall planes.

The hinge assembly can include right and left springs that extend in a longitudinal direction. The right spring can be attached to the right sidewall of the panel or sub-panel and the right upwardly extending side segment of the support member. The left spring can be attached to the left sidewall of the panel or sub-panel and the left upwardly extending side segment of the support member. The springs can thereby bias the panel or sub-panel in a latched position so that the springs attach the panel or sub-panel to the housing to thereby bias the panel or sub-panel in a latched position so the panel or sub-panel remains secured to the housing unless there is a manual action by a user to pull the panel or sub-panel down to open the panel or sub-panel.

The shaft can be a laterally extending shaft that resides along a bottom portion of the housing attached to opposing, laterally spaced apart housing sidewalls. The panel or sub-panel can include opposing right and left sidewalls oriented in planes that are parallel to each other and orthogonal to a front facing wall of the panel or sub-panel. A bottom of the panel or sub-panel right and left sidewalls can have an open channel sized and configured to slidably receive the shaft when in the closed position.

The panel or at least one sub-panel can be side-by-side dual sub-panels that are releasably attached along inner facing adjacent sides to be able to pivot and slide outward together or separately.

The sub-panels can engage at least one unit interlock attached to the unit housing to controllably lock and unlock the sub-panels to allow the sub-panels to open from the unit housing only when there is non-conduction.

Other embodiments are directed to methods of opening a bucket assembly. The methods include: opening a front panel or at least one front sub-panel of a bucket assembly from a closed position to allow access to an interior of the bucket assembly. The opening is carried out by (i) pivoting the front panel or at least one front sub-panel downward about a laterally extending pivot shaft, (ii) sliding the front panel or at least one sub-panel outward away from the pivot shaft, and (iii) further pivoting the front panel or at least one sub-panel to an open position with an upper end of the front panel or at least one sub-panel held at an orientation that is at least 90 degrees rotated from the closed position while the front panel or at least one front sub-panel is slid outward a distance from the pivot shaft.

The method may include biasing the front panel or at least one sub-panel in a latched position so the panel or sub-panel remains secured to a respective housing unless there is a manual action by a user to pull the panel or at least one sub-panel down to open the panel or sub-panel.

Further features, advantages and details of the present invention will be appreciated by those of ordinary skill in the art from a reading of the figures and the detailed description of the preferred embodiments that follow, such description being merely illustrative of the present invention.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

BRIEF DESCRIPTION OF THE DRAWINGS

FIGS. 18A and 18B are rear, side perspective views of exemplary panels with an alternate embodiment of the hinge assembly (shown without the pivot/hinge shaft) that includes a slider block for the arms of the hinge assembly according to embodiments of the present invention. FIG. 18A illustrates the panel slid outward (above the shaft) while FIG. 18B illustrates the panel in a "closed" to unit position according to embodiments of the present invention.

FIG. 19A is a side perspective view of the embodiment shown in FIGS. 18A and 18B.

FIG. 19B is a rear perspective view of the embodiment shown in FIGS. 18A and 18B.

FIG. 21A shows the panel slid outward (raised as shown) a distance above the position shown in FIG. 21B.

DETAILED DESCRIPTION OF EMBODIMENTS OF THE INVENTION

Figures 1, 2:
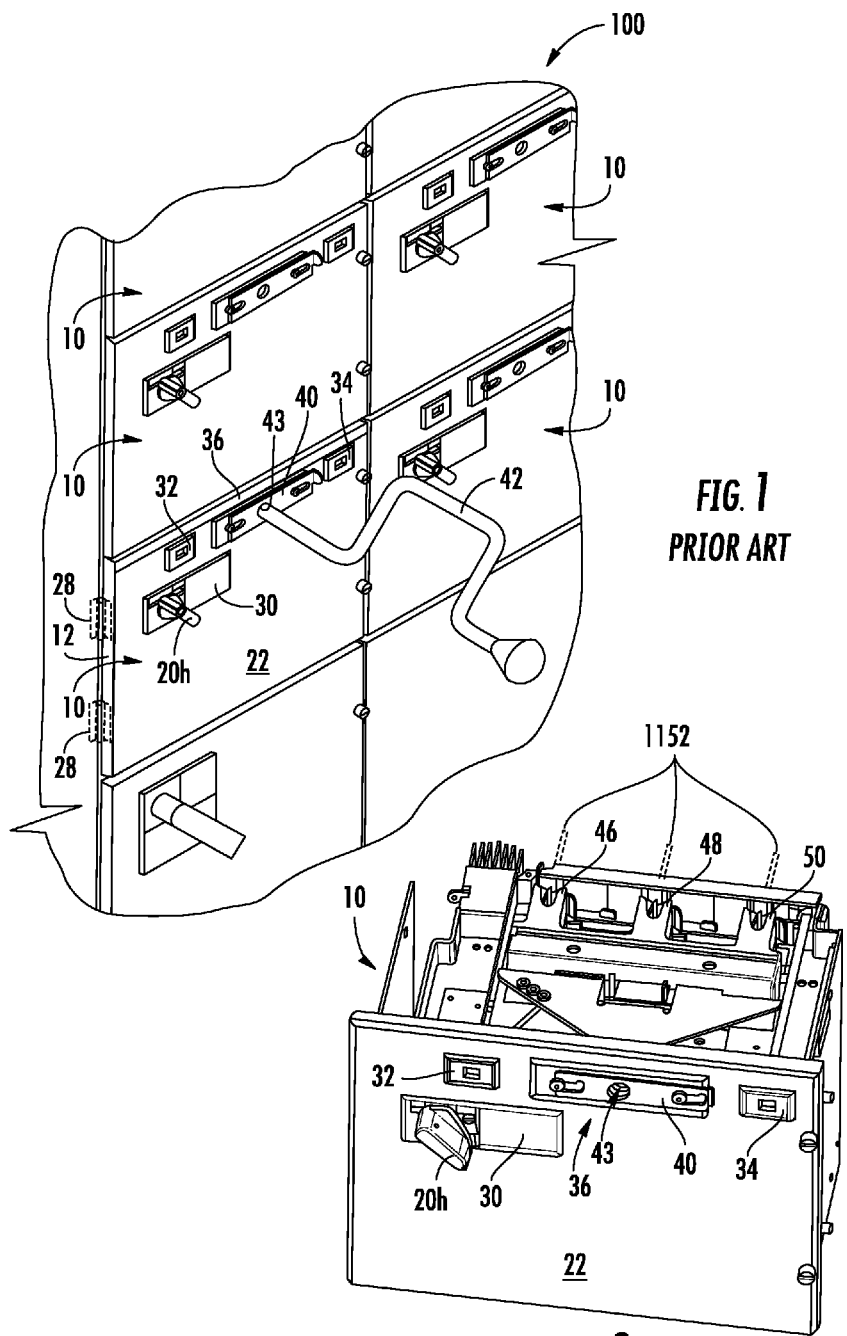
FIG. 1 is a partial front perspective view of an exemplary prior art Motor Control Center (MCC).
FIG. 2 is a top perspective view of an example of a prior art unit of the MCC.

The present invention now will be described more fully hereinafter with reference to the accompanying drawings, in which illustrative embodiments of the invention are shown. Like numbers refer to like elements and different embodiments of like elements can be designated using a different number of superscript indicator apostrophes (e.g., 10, 10', 10", 10'").

In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly.

The term "Figure" is used interchangeably with the abbreviated forms "FIG." and/or "Fig." in the text of the specification and drawings.

The term "about" refers to numbers in a range of +/−20% of the noted value.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, steps, operations, elements, and/or components, but do not preclude the presence or addition of one or more other features, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

The terms "bucket assembly", bucket" and "unit" are used interchangeably and refer to a structure (typically having sides of a protective metal shell) that contains either a switch with a fuse or a circuit breaker for turning power ON and OFF to a motor, or feeder circuit, typically for controlling power to motor starters.

The bucket or unit can be a feeder unit or a starter unit. The bucket can include other components such as a power transformer, a motor starter to control a single motor and PLCs (programmable logic controllers), drives and the like. The bucket can be configured as a modular device to allow the internal components to be assembled as a unit that can be easily installed into a Motor Control Center (MCC) compartment. As is well known, the bucket 10 can have a bus grid with "power stabs" in the back that connect to bus bars 152 (FIG. 2) that carry power (current) to the compartments of a vertical section in an MCC cabinet 100 (FIG. 1). The bus bars can be connected to larger horizontal bus bars that bring power to the vertical sections. The horizontal bus bars are usually in the top, but some MCC designs may have them in the center or bottom. The bucket or unit may be configured to be a removable modular unit capable of being installed behind individual or combined sealed doors on the motor control center enclosure. The unit may contain various motor control and motor protection components such as motor controllers, starters, contactor assemblies, overload relays, circuit breakers, motor circuit protectors, various disconnects, and similar devices for electric motors. The unit can be configured to connect to a common power bus of the motor control center and conduct supply power to the line side of the motor control devices for operation of motors or feeder circuits.

A "feeder unit" refers to a motor control center unit for supplying feeder circuits. A feeder unit may have one or more feeders or power supply lines to supply feeder circuits or devices. A feeder unit (also called a "feeder") can have a "line side", which refers to the side of the feeder configured to be directly or indirectly connected to the common power bus of the motor control center. A feeder can also have a "load side", which refers to the side of the feeder configured to be connected to and deliver current to a feeder circuit. A feeder may comprise a circuit breaker, a fuse and disconnect switch, or another configuration. The terms "feeder circuit"

and "feeder device" are used interchangeably and are intended to mean circuits or devices connected to feeder units or "feeders".

A "circuit breaker", "breaker", "molded case circuit breaker", or "MCCB" is a device designed to open and close a circuit, typically allowing both manual open and close operation and automatic circuit interruption, the latter to open a circuit under certain conditions, e.g., an over-current. The circuit breaker can be for a motor starter unit or feeder unit, for example.

The terms "motor", "load", and "load device" are used interchangeably and are intended to mean devices bearing electrical load that are connected to and controlled by the motor control center. Load devices are typically motors but may also be pumps or other machinery that may comprise motors or pumps. Load devices may be connected to starter units.

The terms "operating mechanism" and "operator mechanism" are used interchangeably and refer to an assembly for opening and closing separable main contacts in a circuit breaker or for turning power ON and OFF using a switch associated with a fuse as a disconnect.

MCCs usually have a wire way for wires from respective units 10 to the motors and other loads and control wires. U.S. Patent Application Publication 2013/0077210 describes an MCC with both right and left side wireways, the contents of which are hereby incorporated by reference as if recited in full herein. The wireways are typically provided as an enclosed space in an MCC cabinet proximate but outside stacked units. MCCs can be configured in many ways. Each compartment can have a different height to accept different frame sizes of respective bucket assemblies or units 10, typically in about 6-inch increments. The vertical bus can be omitted or not run through the full height of the section to accommodate deeper buckets for larger items like variable frequency drives. The MCC can be a modular cabinet system for powering and controlling motors or feeder circuits. Several may be powered from main switchgear which, in turn, gets its power from a transformer attached to the incoming line from the power company. A typical MCC cabinet is an enclosure with a number of small doors arranged in rows and columns along the front. The back and sides are typically flat and mostly featureless. The buckets can be provided in varying sizes. For starter units, the size can be based on the size of the motor they are controlling. The bucket assembly can be configured to be relatively easily removable for repair, service or replacement. MCCs can have regular starters, reversing starters, soft start, and variable frequency drives. MCCs can be configured so that sections can be added for expansion if needed. The buckets or units 10 of a motor control center 100 can have the same or different configurations.

Figure 3:
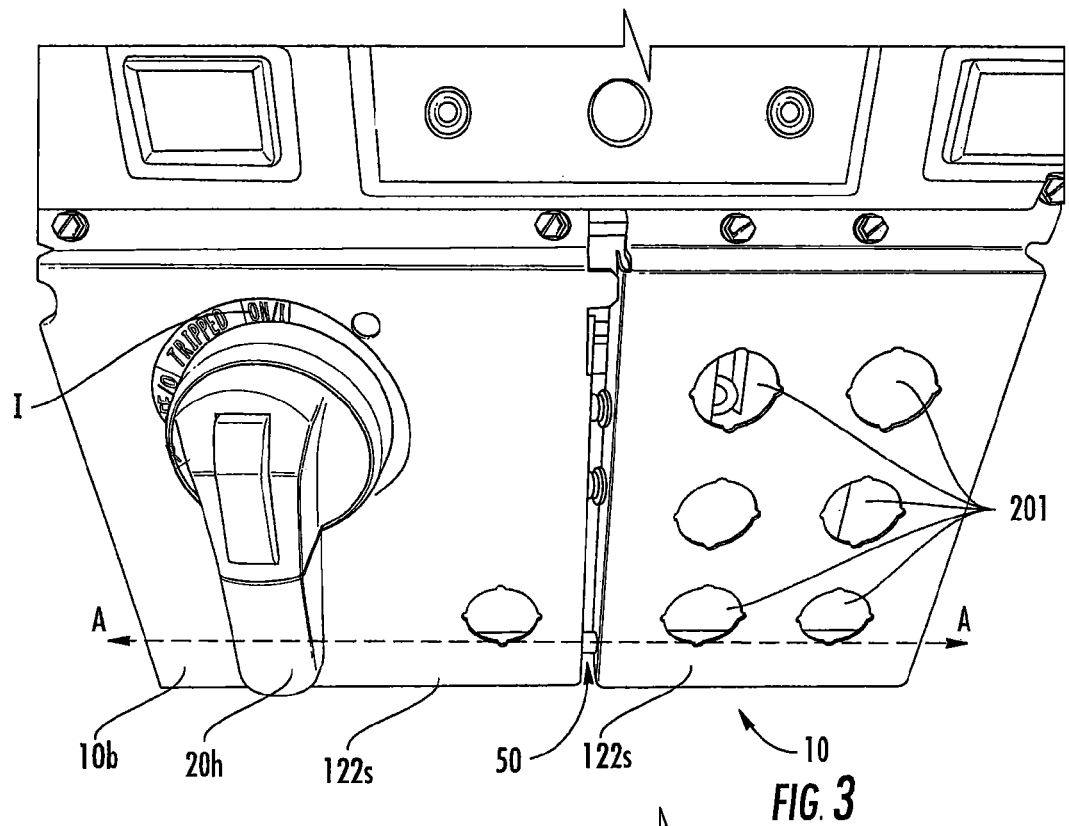
FIG. 3 is a front, top perspective view of an exemplary unit with a front panel having a telescoping hinge configuration according to embodiments of the present invention.
Figure 4:
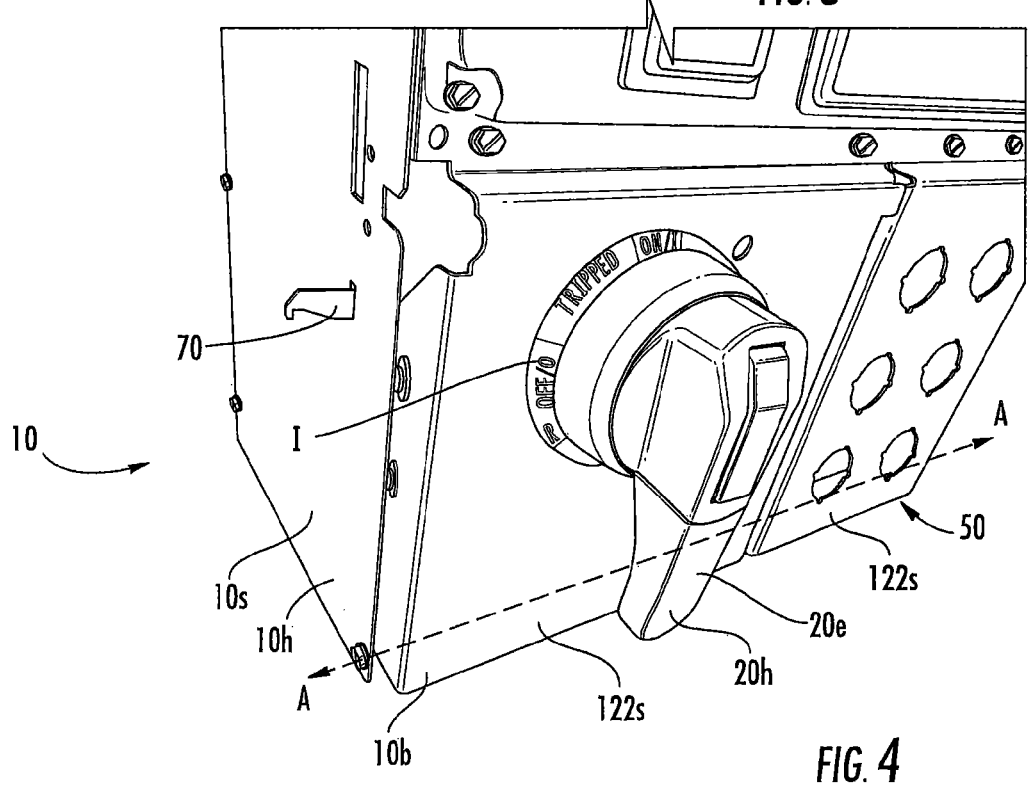
FIG. 4 is a front, side perspective view they unit shown in FIG. 3.
Figure 5:
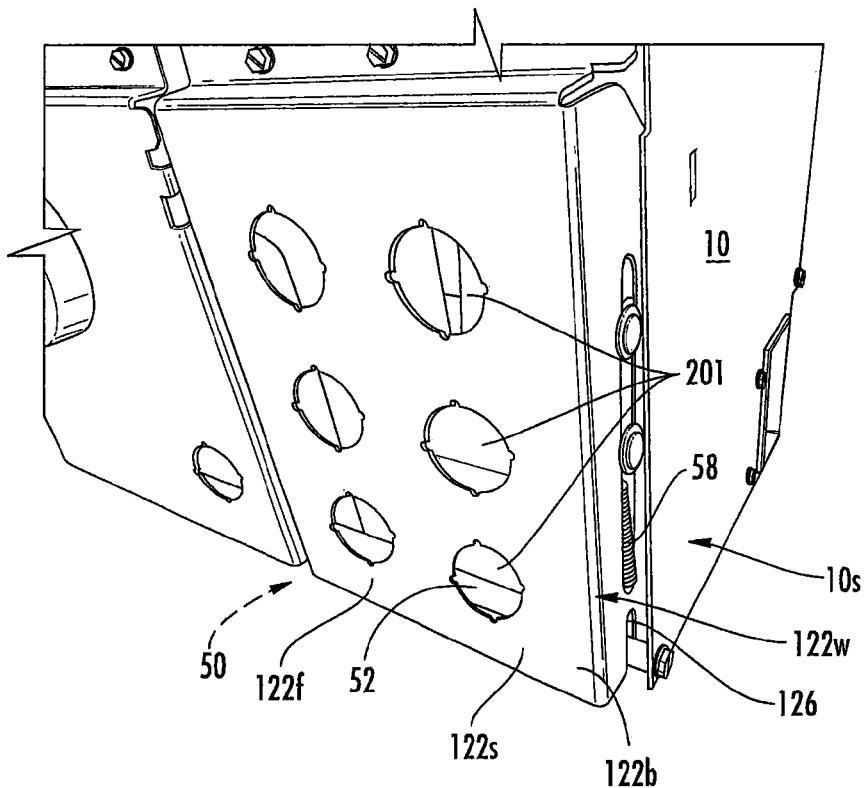
FIG. 5 is front, side perspective view of the unit shown in FIG. 3, opposite from the side shown in FIG. 4.

The terms "right side" and "left side" refer when the unit or MCC is viewed from the front, e.g., the front is associated with the unit 10 orientation shown in FIGS. 3 and 4, for example, with a handle operator 20h facing forward as shown in FIGS. 3 and 4. A respective unit 10 may include a single operator handle 20h or a plurality of operator handles 20h, typically a single one on the right side of the panel 122 or sub-panel 122s or one on the left side of the panel 122 or sub-panel 122s or a single one on the right side and a single one on the left side of a respective panel 122 or subpanel 122s.

The term "compact" refers to units 10 held in a condensed configuration (package) relative to conventional units/buckets. The MCC structure or cabinet 100 (FIG. 1) can be designed to receive multiple bucket units 10 ranging in various defined sizes. The units 10 can be provided in package or frame sizes of about 6 inches to about 72 inches (tall) with substantially common depth and width dimensions, known as 1X (6 inches) to 12X (72 inches) sizes. The sizes can be in single X increments, from 1X, 2X, 3X, 4X, 5X, 6X, 7X, 8X, 9X, 10X, 11X and 12X. Thus, a 5X MCC unit 10 can be about 30 inches tall. The frame sizes can be provided for a plurality of amperages, including a plurality of: 125A, 150A, 225A, 250A, 400A, 600A, 1200A and 2000A, for example. A unit 10 is typically about 7 inches deep but larger or smaller sizes may be appropriate in some embodiments.

Embodiments of the invention provide the handle operators 20h as rotary handles rather than conventional UP/Down handles found on conventional units such as, for example, the Freedom 2100 MCC from Eaton, Corporation, as is well known.

FIGS. 3-13 illustrate examples of a unit 10 with a single rotary handle operator 20h. However, the unit 10 may also include more than one handle operator as shown, for example, in FIG. 22.

In some embodiments, as shown in FIGS. 3-13, for example, the rotary handle operator 20h can have a long handle configuration so that the handle has a lever and/or extension 20e that extends a length beyond a perimeter of a circle associated with the rotating part of the operator handle 20h. The "long" handle version of a handle operator 20h can provide additional torque control for some applications.

Figure 22:
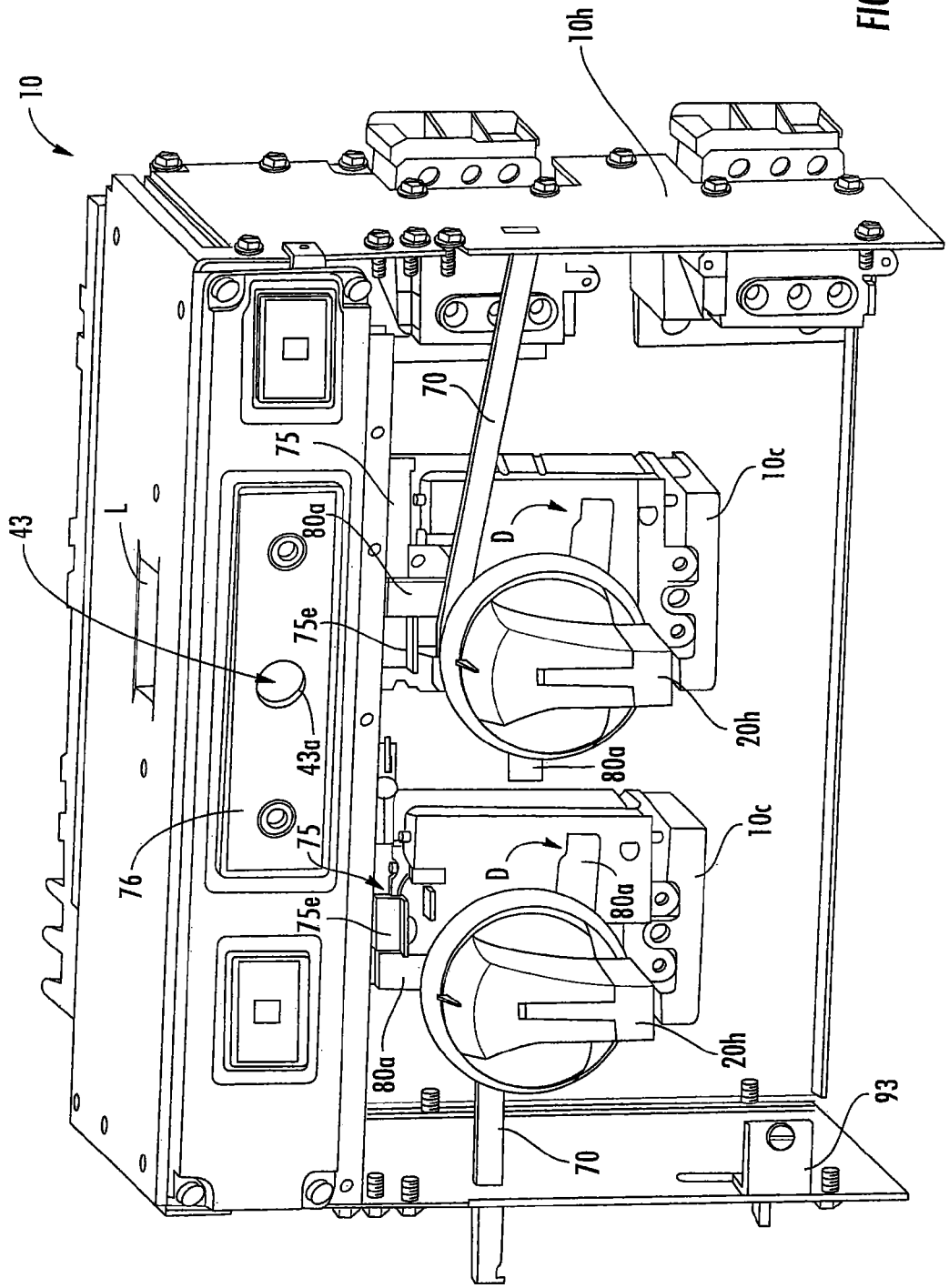
FIG. 22 illustrates that the bucket/unit may be configured to have dual handle operators that can be held on a single panel or dual panels with the telescoping hinge assemblies according to some embodiments of the present invention.

FIG. 22 illustrates a "short" handle version which has a substantially circular configuration, e.g., no extension lever required. An intermediate length handle may also be used for some embodiments (not shown).

Figure 13:
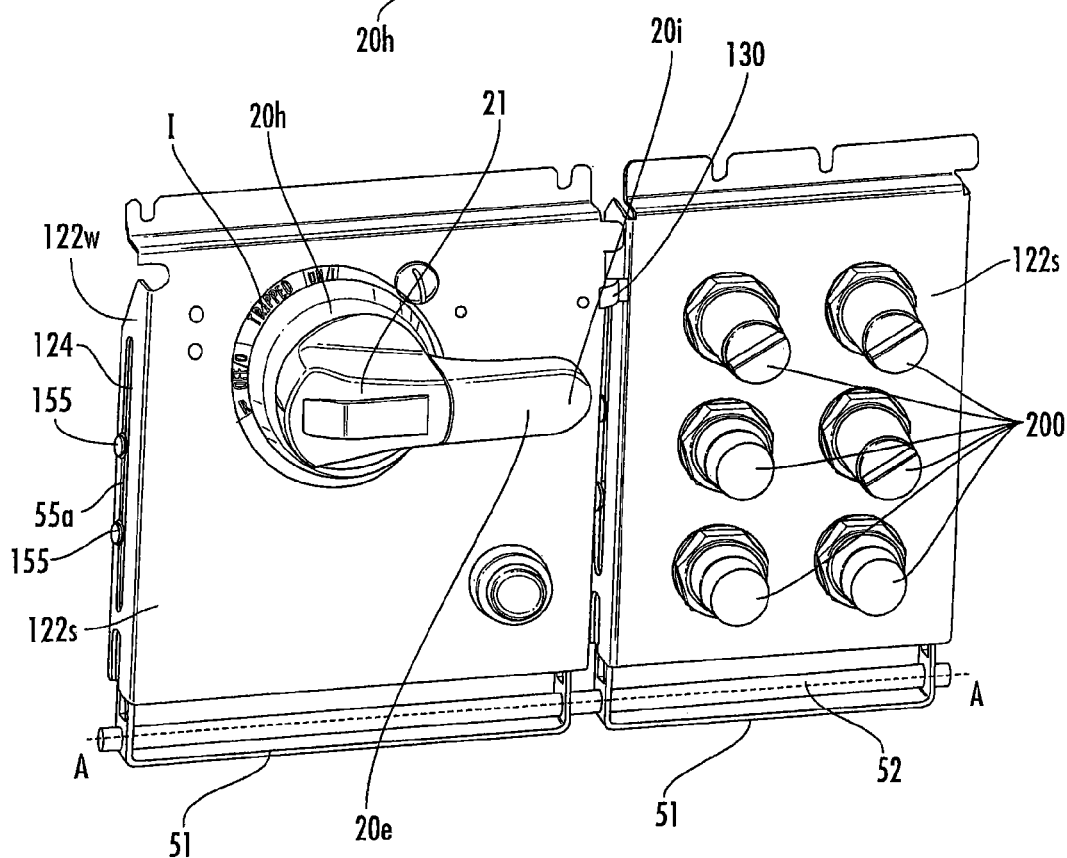
FIG. 13 is a side, front perspective view of the handle operator and pilot device panels and hinge assembly shown as a sub-assembly apart from the unit housing and illustrating the handle operator in an ON position according to embodiments of the present invention.

Referring to FIG. 13, the length of the lever of the handle 20h can be sufficient to place an inner end of the lever 20i adjacent (or even over) the device panel or pilot devices held on the device panel. With prior panel configurations, there is a potential interference issue for units 10 that have long rotary handle operators 20h for pilot devices that are mounted on an adjacent landscape-oriented device panel when the operator handle 20h is rotated so that its extension or lever is in a horizontal ON position (IEC convention). FIG. 13 illustrates the exemplary OFF position.

The term "pilot device" refers to various control input members and/or indicating light devices. The pilot devices can include pilot control devices, indicating lights, user inputs such as push buttons and/or selector switches and the like. There are many different variations that can be used as is well known to those of skill in the art.

The unit 10 can include a unitary single panel 122 (FIG. 24) or (typically dual) adjacent sub-panels 122s (FIGS. 3-13, for example).

Where sub-panels are used rather than a unitary panel 122 (FIG. 24), each sub-panel 122s can hold a handle operator 20h or one sub-panel can hold one or more handle operators 20h and the other can hold pilot devices 200 (FIG. 13). The sub-panel 122 that holds the pilot devices 200 (FIG. 13) can include at least one pilot device aperture 201 that allows the corresponding pilot device to allow the front of the device 200 to extend through the sub-panel 122s to expose a front face of a respective pilot device. As shown in FIGS. 3-13, there can be six, two columns of three, pilot device apertures 201, but less or more than six may be used. Other arrangements of the pilot devices 200 and apertures 201 may also be used. Thus, while six devices 200 and respective holding or receiving apertures 201 are shown, the device sub-panel 122s can be configured with more or less apertures and hold more or less control input members and/or indicating lights, for example.

Figure 6A:
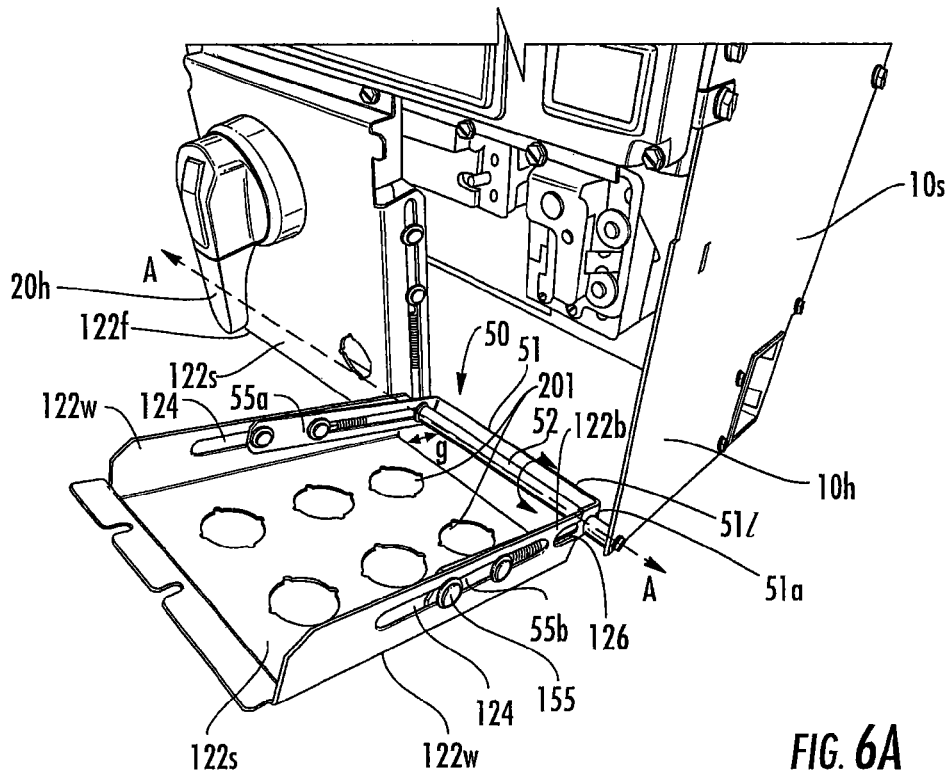
FIG. 6A is a side perspective view of the unit shown in FIGS. 3-5, illustrating a pilot device panel pivoted down from the unit and illustrating components of the telescoping hinge assembly according to embodiments of the present invention.
Figure 10:
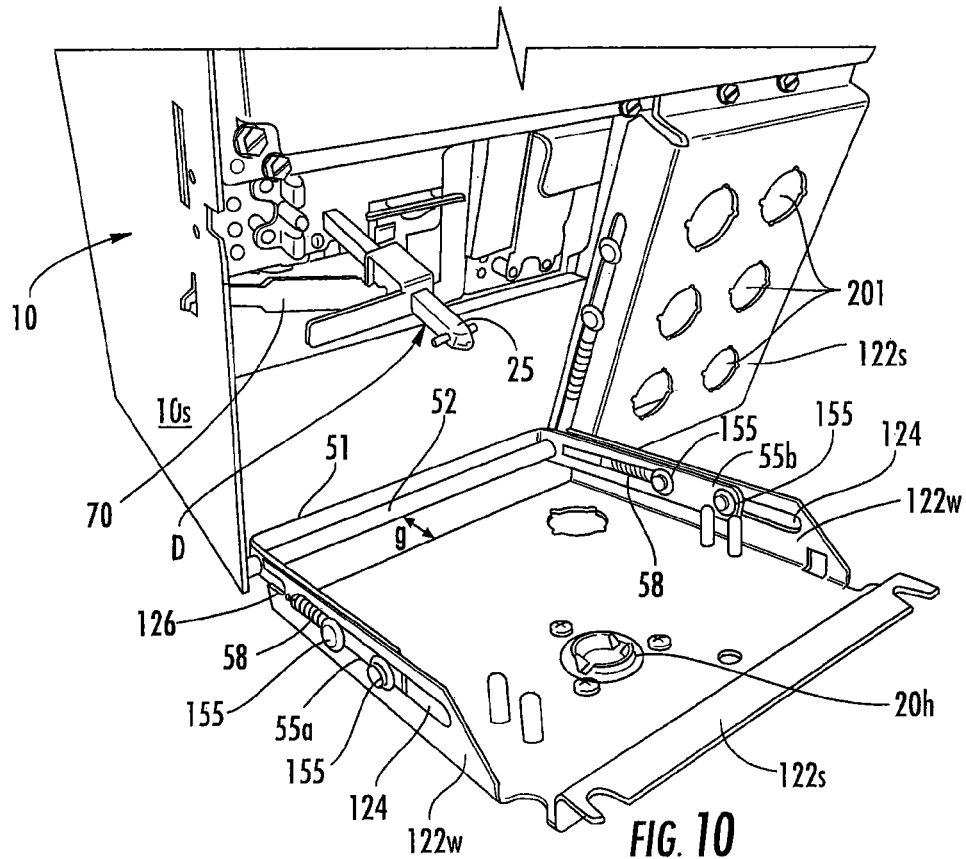
FIG. 10 is a side, perspective view of the unit shown in FIGS. 3 and 4 illustrating a handle operator panel pivoted down from the unit and illustrating components of the telescoping hinge assembly according to embodiments of the present invention.
Figure 11A:
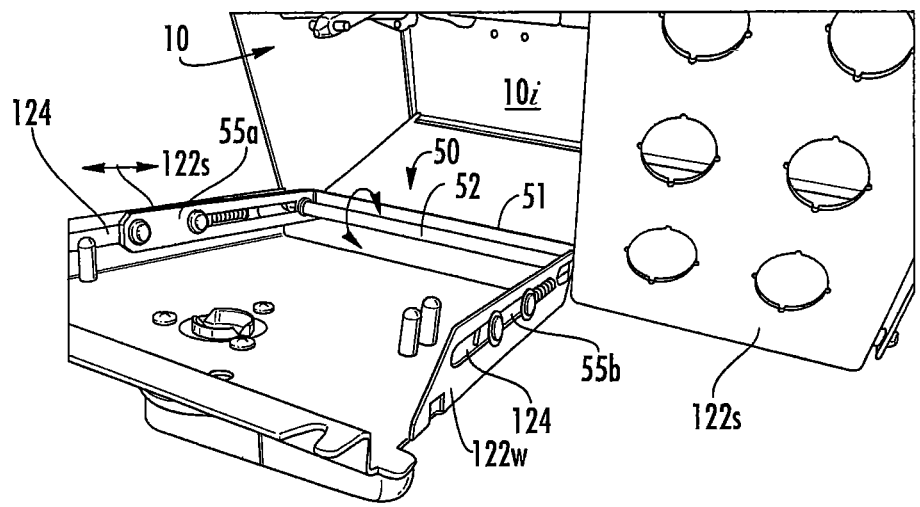
FIG. 11A is an enlarged, opposing side perspective view of the handle operator panel and hinge assembly shown in FIG. 10.
Figure 11B:
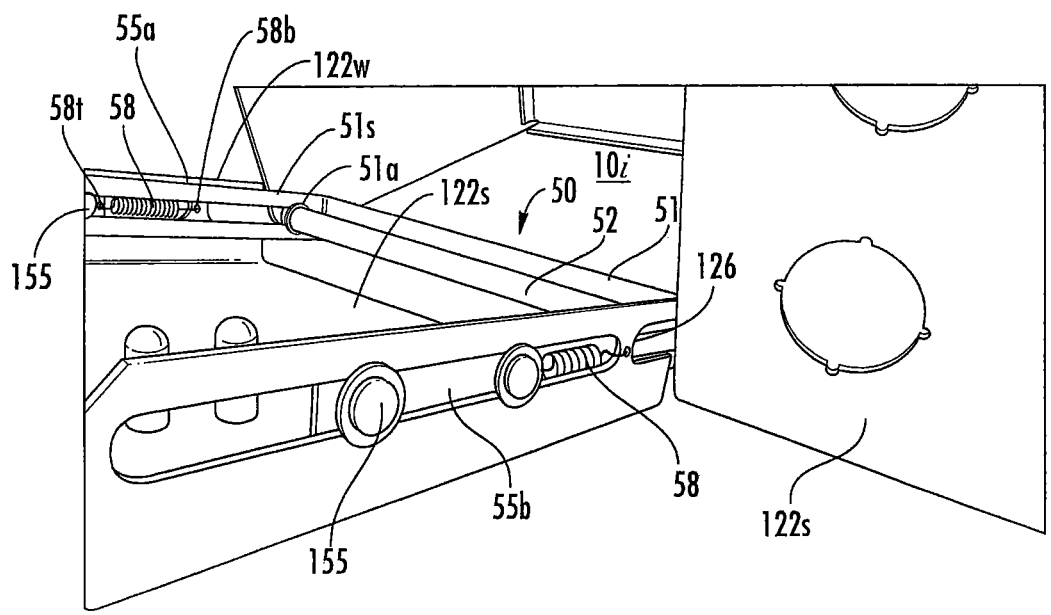
FIG. 11B is an enlarged side perspective view of a portion of the handle operator panel and hinge assembly shown in FIG. 11A.

Referring to FIGS. 3-13, embodiments of the present invention configure the unit 10 with a hinge assembly 50 that is configured with at least one laterally extending shaft 52 that typically resides along the bottom of the unit 10 to allow the panel 122 or each sub-panel 122s to (i) swing down about a laterally extending hinge axis A-A that extends axially through an axially extending centerline of the shaft 52 as shown in FIGS. 6A and 11A and (ii) slide radially with respect to the shaft 52, e.g., outwardly away from the unit housing 10h, in no required order. This can be described as a "telescoping" hinge assembly 50.

Typically, the panel 122 or sub-panel 122s is pivoted open to less than 90 degrees, then slid outward from the shaft 52 and pivoted open a further amount to allow the panel/sub-panel to open at least 90 degrees, even when held adjacent an underlying unit 10. Although shown as a single shaft 52 that extends across each sub-panel 122s, more than one shaft can be used, such as a first shaft for the first sub-panel 122s and a second shaft for the second sub-panel 122s. Although the shaft 52 is shown as being cylindrical, other shapes may be used.

Also, although shown as extending across the bottom 10b of a respective unit or bucket 10, the hinge assembly 50 may be configured with the shaft 52 along a side or up and down across a unit to allow for telescoping opening about a vertical axis rather than horizontally (not shown). It is also contemplated that for certain non-MCC uses, the shaft 52 may be along the top rather than the bottom of the housing.

Figure 6B:
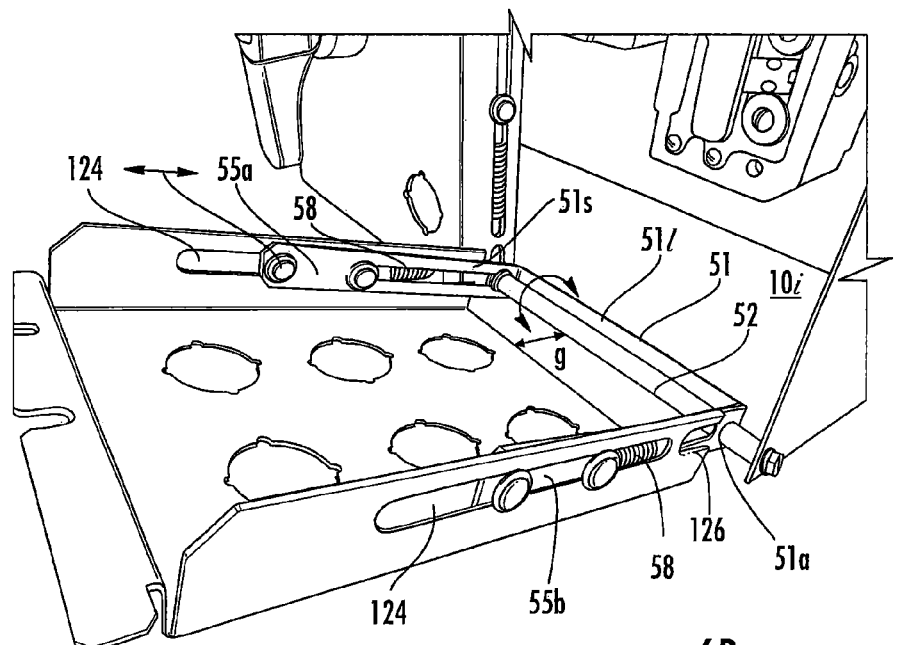
FIG. 6B is an enlarged side perspective view of the pilot device panel and hinge assembly shown in FIG. 6A.
Figure 6C:
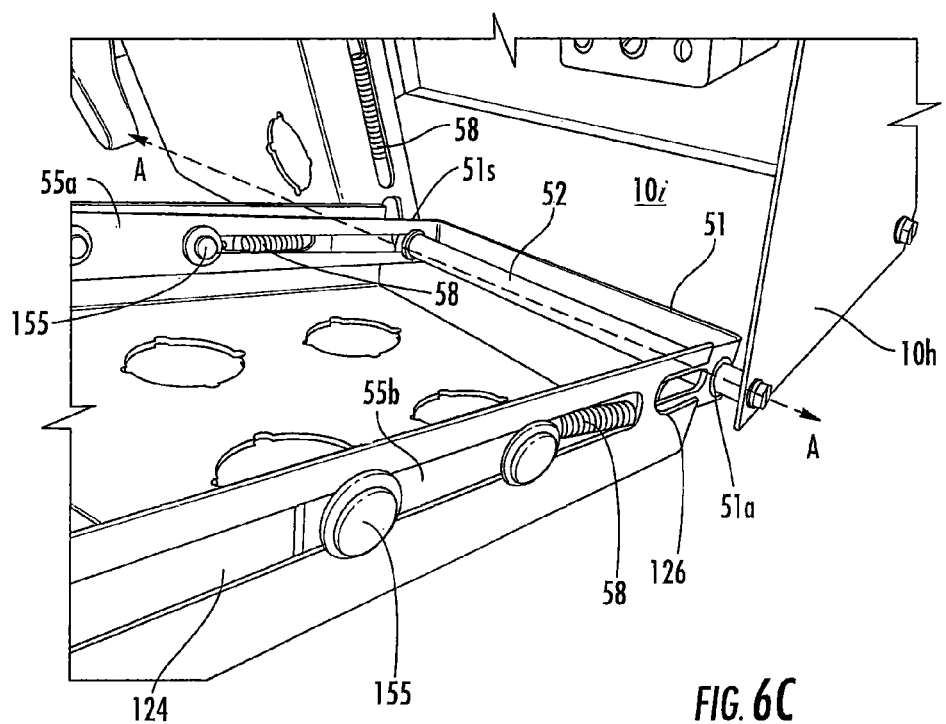
FIG. 6C is an enlarged side perspective view of a portion of the pilot device panel and hinge assembly shown in FIG. 6B.
Figure 7:
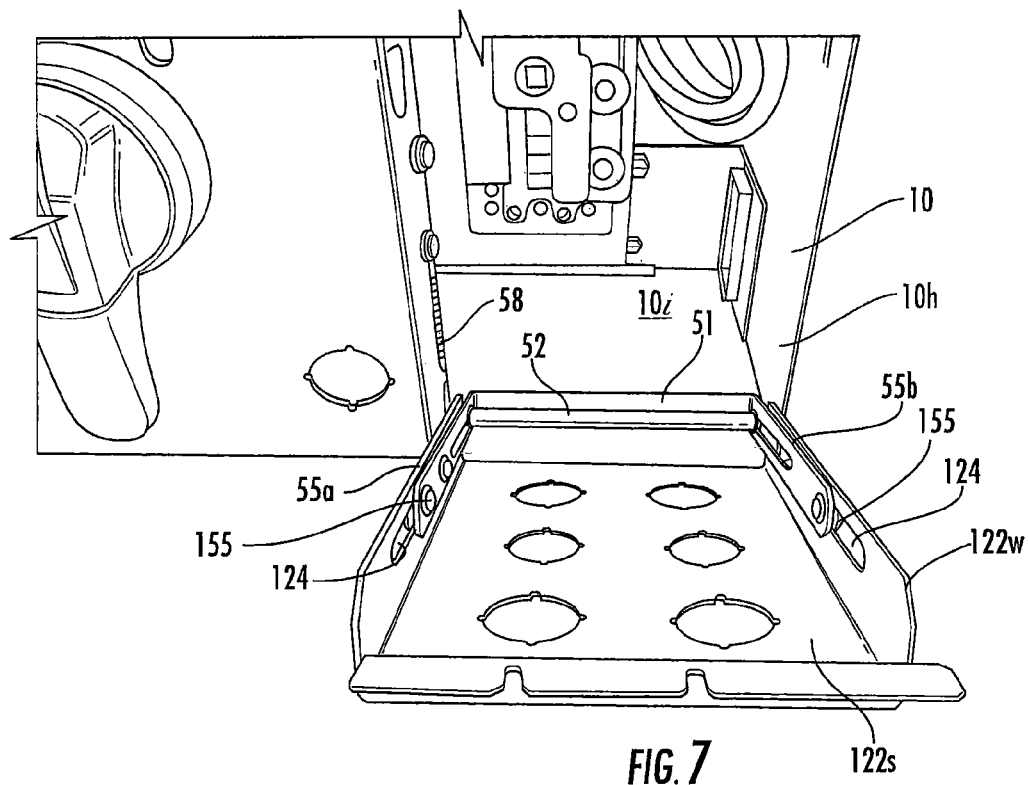
FIG. 7 is an end, perspective view of the pilot panel and hinge assembly shown in FIG. 6A.
Figure 24:
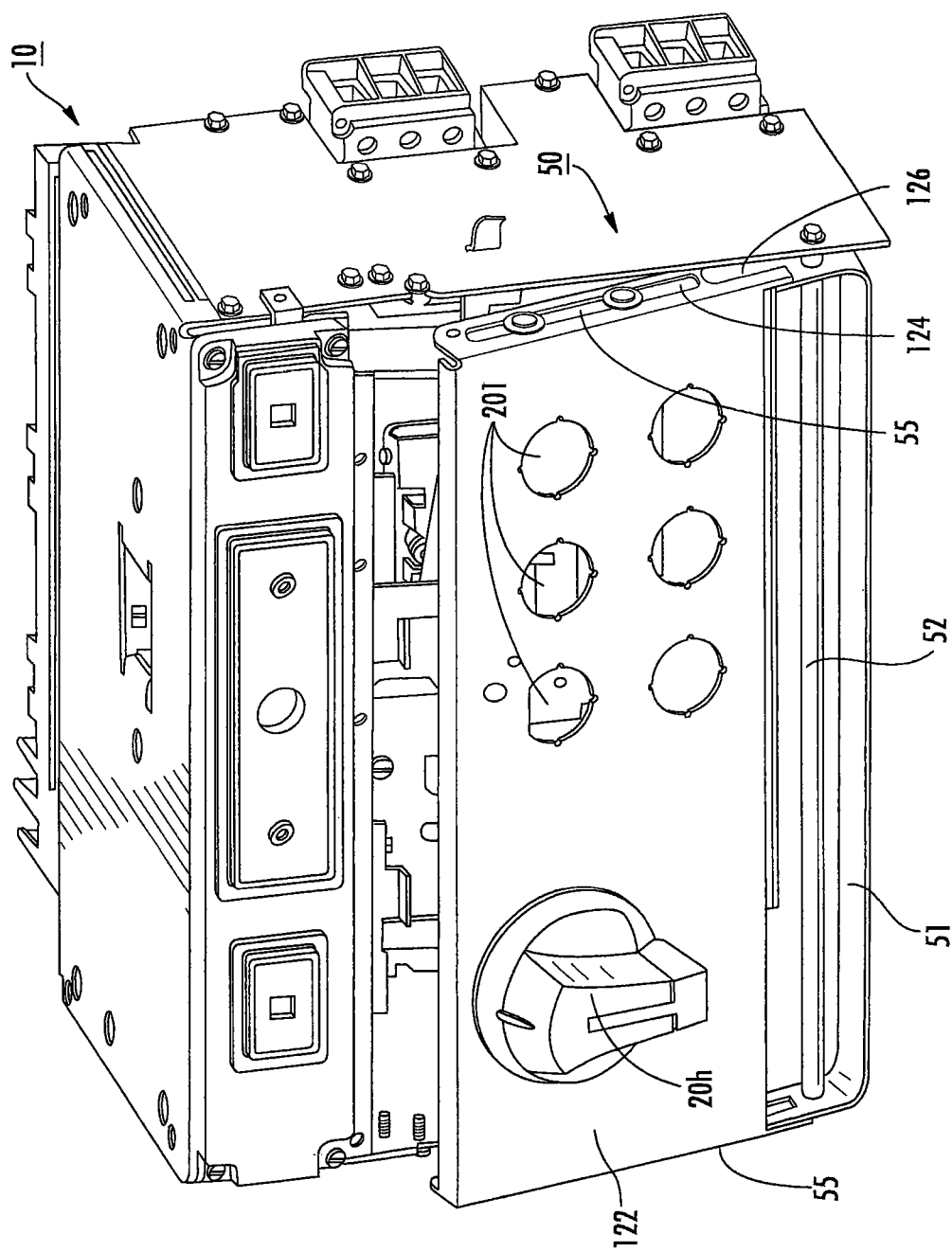
FIG. 24 illustrates a front perspective view of the bucket/unit showing the telescoping hinge assembly with a single panel that holds either a plurality of handle operators or a handle operator and pilot devices according to embodiments of the present invention.

Referring to FIGS. 6A and 6B, the hinge assembly 50 can include a support member 51 that can include laterally spaced apart first and second slide arms 55a, 55b that can be slidably attached to respective opposing sides (e.g., right and left sides) of a sub-panel 122s or a unitary panel 122 (FIG. 24). The first and second arms 55a, 55b can slidably extend and retract in respective spaced apart right and left slots 124 formed in or attached to the right and left side walls 122w of the sub-panel 122s or panel 122 to allow the sub-panel 122s or panel 122 to slide outwardly away from the shaft 52. The slots 124 can reside in a sidewall 122w that is in a plane that is perpendicular to the front face of the panel 122f. The shaft 52 can extend through apertures 51a in the support member 51.

Additionally or alternatively, in some embodiments, the slide arms 55a, 55b can be fixedly attached to the panel 122 or sub-panel 122s and the support member 51 (e.g, frame or other mounting attachment member) attached to the shaft 52 can have longitudally extending slots (extending in a direction perpendicular to the axially extending centerline (A-A axis) of the shaft 52) that allow the panel-mounted slide arms 55a, 55b to slide in the slots in or on the support member (not shown), again to allow the panel 122 or sub-panel 122s to slide radially with respect to the shaft, e.g., away from the shaft 52 to open.

The first and second arms 55a, 55b of the hinge assembly 50 can include one or more attachment members 155 that attach the respective arms 55a, 55b to the corresponding sidewall 122w and allow the panel or subpanel 122, 122s to slide back and forth between a home or retracted position (the bottom of the panel 122/122s residing over the shaft 52) to one or more different extension distances for service access. The attachment members 155 can extend through a respective slot 124 to allow the panel or sub-panel 122, 122s to slide outward a distance away from the pivot shaft 52 and define an open space or gap "g" between the bottom 122b of the panel or sub-panels 122, 122s and the shaft 52 as shown, for example, in FIGS. 6A, 6B, 8, 10 and 16.

The panel 122 and/or sub-panels 122s can be configured to slide out a distance from the housing sidewall 10s and/or pivot shaft 52 that is in a range of between about 0.25 inches to about 3 inches, inclusive of same. More typically, the distance is between about 0.5 inches and about 1.5 inches, such as 0.5 inches, 0.75 inches, 1 inch, 1.25 inches or 1.5 inches, in some embodiments.

The sidewall 122w of the panel 122 or sub-panel 122s can have a bottom 122b with an open slot 126 that allows the panel or sub-panel 122, 122s to travel over and receive the shaft 52 when closed. A closed end of the open slot 126 can be arcuate. When closed against the unit housing 10h, this configuration allows the shaft 52 to reside behind the flat front surface 122f of the panel or subpanel and above the bottom edge 122b of the panel 122 or respective sub-panel 122s.

As shown in FIGS. 6A-6C, 10-12 and 17, the hinge assembly 50 can optionally include a support member 51, that may be configured as or include a frame 51f (as more readliy shown in FIG. 17), that cooperates with the panel 122 and/or sub-panel 122s. The support member 51 can have a laterally extending segment 51l that resides below the shaft 52 and that includes upwardly extending support member sides 51s that define or attach to the first and second arms 55a, 55b. The support member 51 can be configured as the frame 51f, and, where used, the frame 51f can be a monolithic unitary "U" shaped member or may have other configurations.

The support member (e.g., frame) sides 51s can have an aperture 51a for the shaft 52. However, the arms 55a, 55b and attachment arrangements may have other configurations.

The hinge assembly 50 can be configured to allow a user to push the panel 122 or sub-panel 122s downward to de-latch it from the bucket 10, then pull the panel 122 or sub-panel 122s outward to allow it to clear an MCC bucket 10 residing below it in a MCC cabinet 100 (FIG. 1), then swing it open to at least a position of 90-degrees from its closed position on the unit 10, typically between 90 degrees to 180 degrees from the closed position. Full access to the interior 10i of the MCC unit 10 behind the respective panel 122 or sub-panel 122 when open allows for servicing interior components of the MCC bucket/unit 10.

Figure 8:
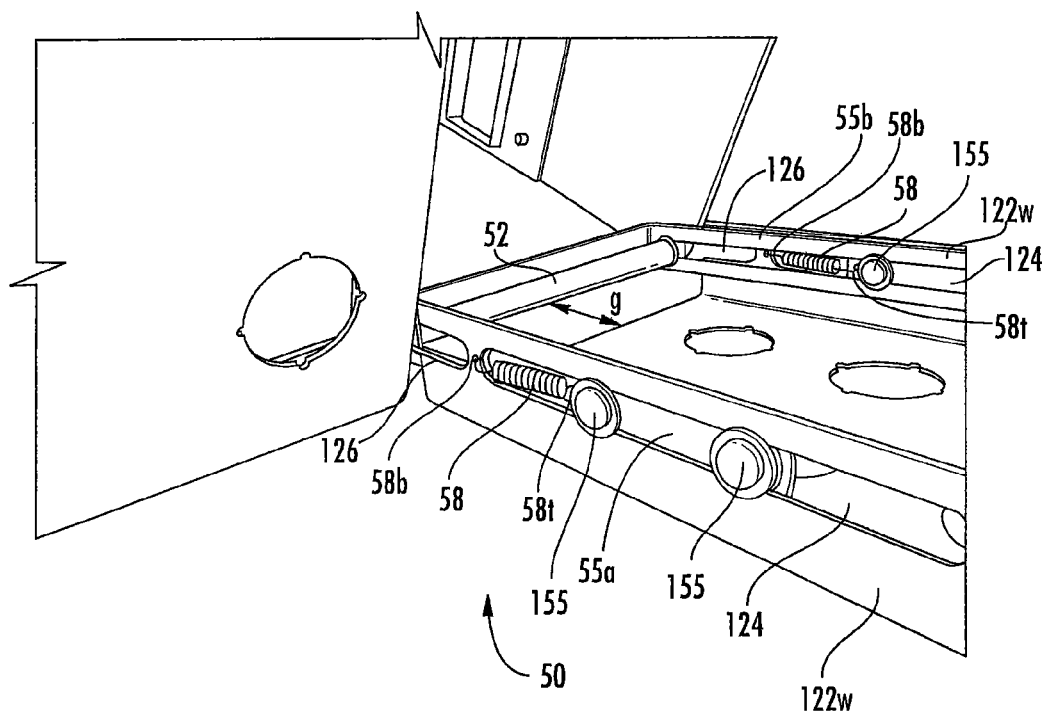
FIG. 8 is an enlarged opposite side, perspective view of the pilot device panel and hinge assembly shown in FIG. 6B.
Figure 9:
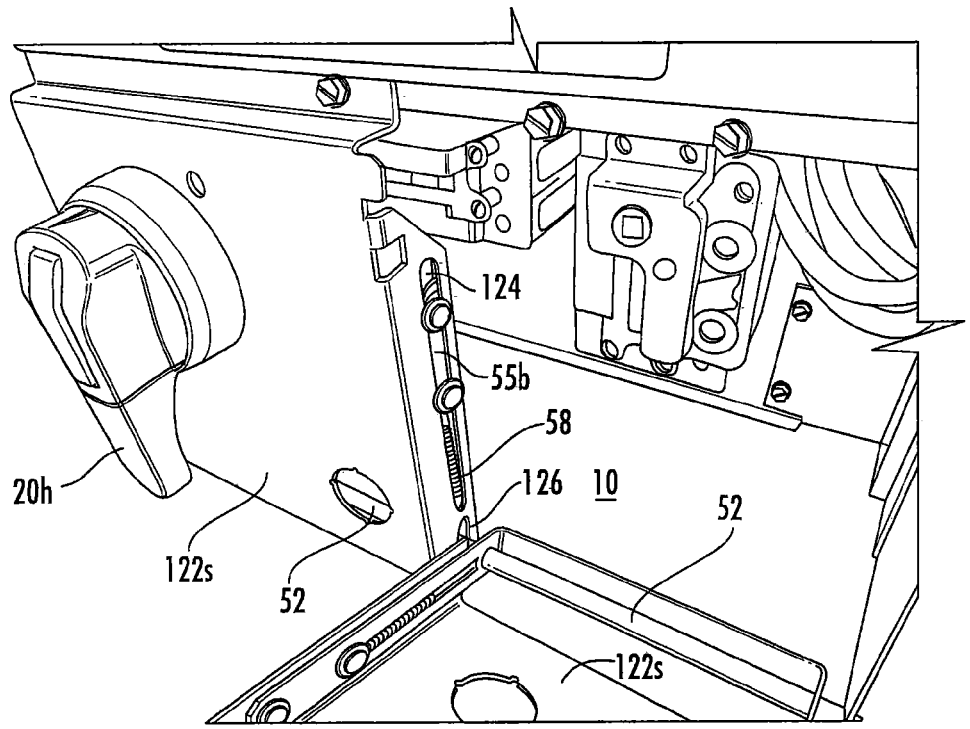
FIG. 9 is a top perspective view of the side of the pilot device panel shown in FIG. 8 and illustrates an adjacent side of the handle operator panel and hinge assembly according to embodiments of the present invention.

Referring to FIG. 8, the hinge assembly 50 can include springs 58, at least one for each side of the panel 122 or sub-panel 122s. A respective spring 58 can have opposing top and bottom end portions 58t, 58b, one of which is attached to the panel 122 or sub-panel 122s, 122s and the other end is attached to the arm 55a or 55b. The end portions of the springs 58t, 58b can have hooks or can be attached in any suitable manner. The springs 58 can be configured to bias the panel 122 or sub-panel 122s toward a closed position. As shown, the bottom of respective springs 58b is attached to a lower end portion of the adjacent sub-panel side wall 122w while the top of the spring 58t is attached to the arm 55a, 55b.

Figure 14:
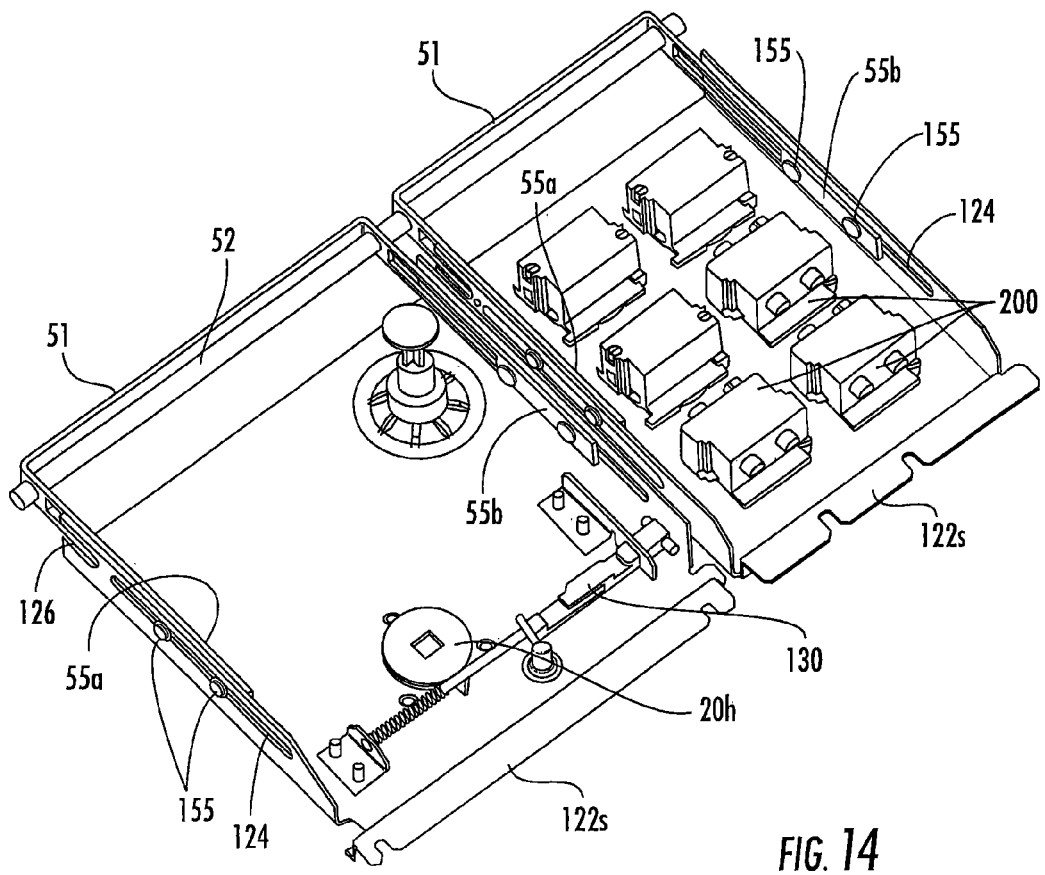
FIG. 14 is a rear perspective view of the sub-assembly shown in FIG. 13 according to embodiments of the present invention.
Figure 15:
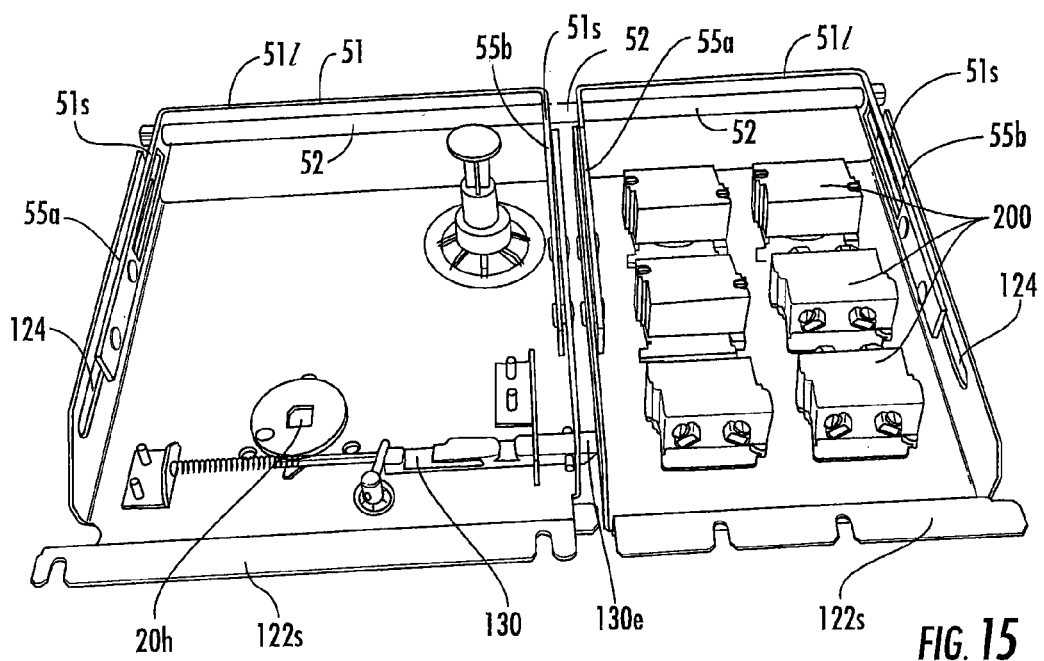
FIG. 15 is an end, rear perspective view of the sub-assembly shown in FIG. 13 according to embodiments of the present invention.
Figure 25:
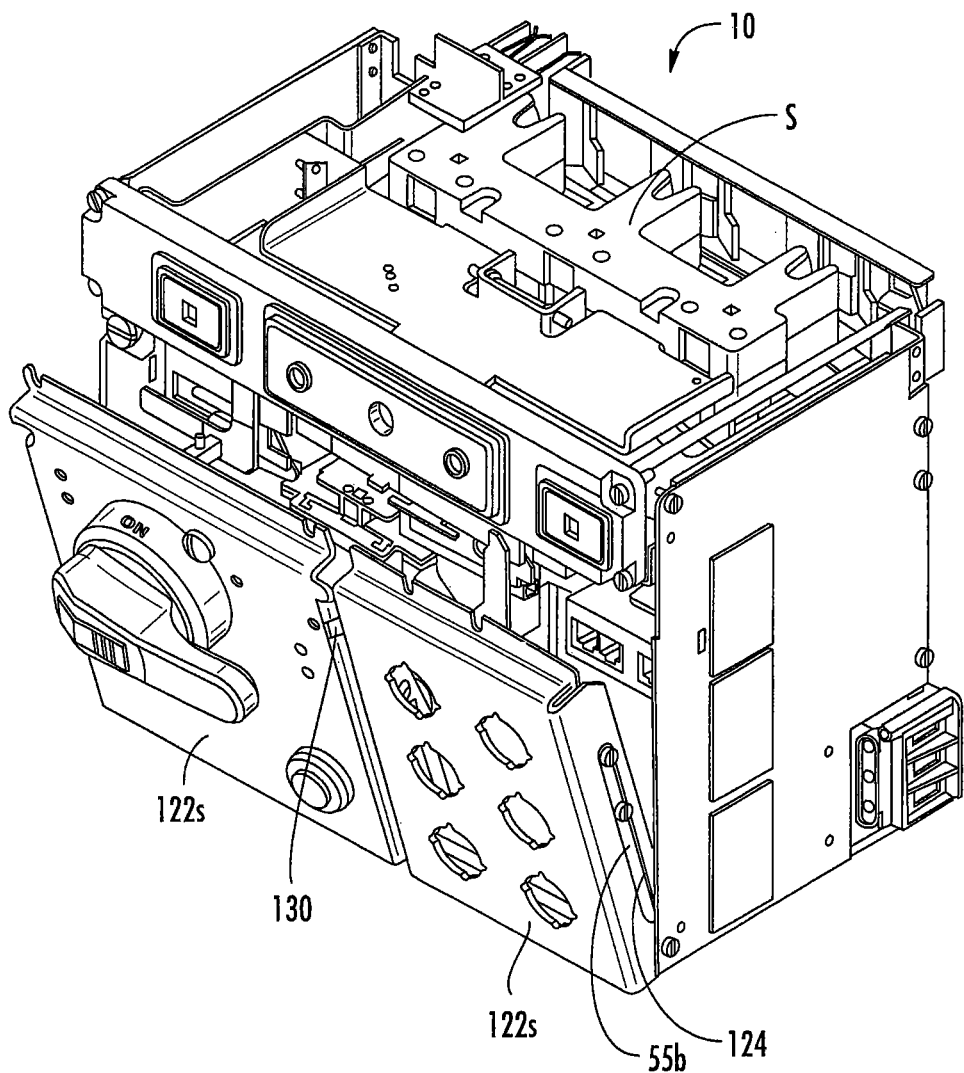
FIG. 25 is a side, front perspective view of a bucket/unit illustrating dual panels that can be locked together to pivot and telescopically slide outward in concert according to embodiments of the present invention.

In some embodiments, the sub-panels 122s may be configured to lock together and pivot out in concert to open and/or close as a unitary panel assembly as shown in FIG. 25. FIGS. 13-15 illustrate a panel to panel interlock assembly 130 with an end portion 130 that can extend from one panel across to the other panel 122s to lock the panels 122s together.

Figure 12:
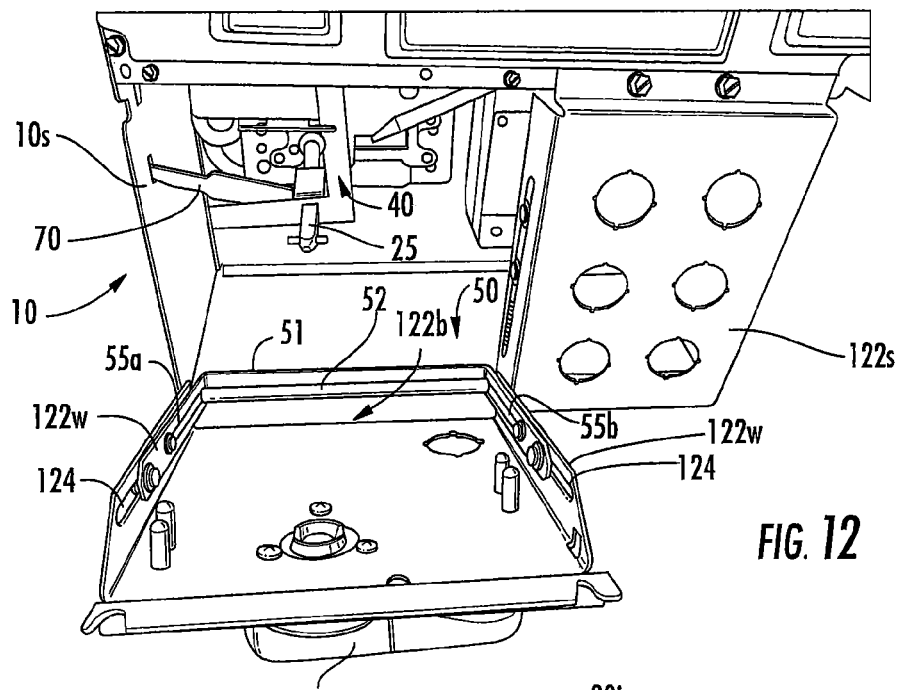
FIG. 12 is an end perspective view of the handle operator panel shown in FIGS. 11A and 11B according to embodiments of the present invention.

FIGS. 4, 10 and 12, for example, illustrate that the unit 10 can include an interlock linkage 70 that extends out of an aperture in an adjacent sidewall 10s of the unit housing 10h. The interlock linkage 70 can include a link with one end portion attached to an inwardly extending shaft 25 that, in operation, is connected to the handle operator 20h. The shaft 25 is also in communication with the operator mechanism 40 of the circuit breaker disconnect D. The link can extend straight outward from a respective shaft 25 through the sidewall 10s. As shown, the interlock linkage 70 is left linkage and has a left link with an end portion that is configured to extend out of a left sidewall of the unit housing when the left operator disconnect handle is in the ON position.

Referring to FIGS. 13-15, for example, the sub-panels 122s can be configured as two side-by-side adjacent panels that can open and close independently and also can be locked together to open and close in concert. Thus, in some embodiments, the shaft 52 can extend across the unit 10 to attach to the right and left housing sidewalls 10s and can be attached to two separate frames 51, e.g., right and left frames, that can each pivot about the common shaft. Each frame 51 can cooperate with a respective sub-panel 122s and define or attach to pair of cooperating arms 55a, 55b.

Figure 16A:
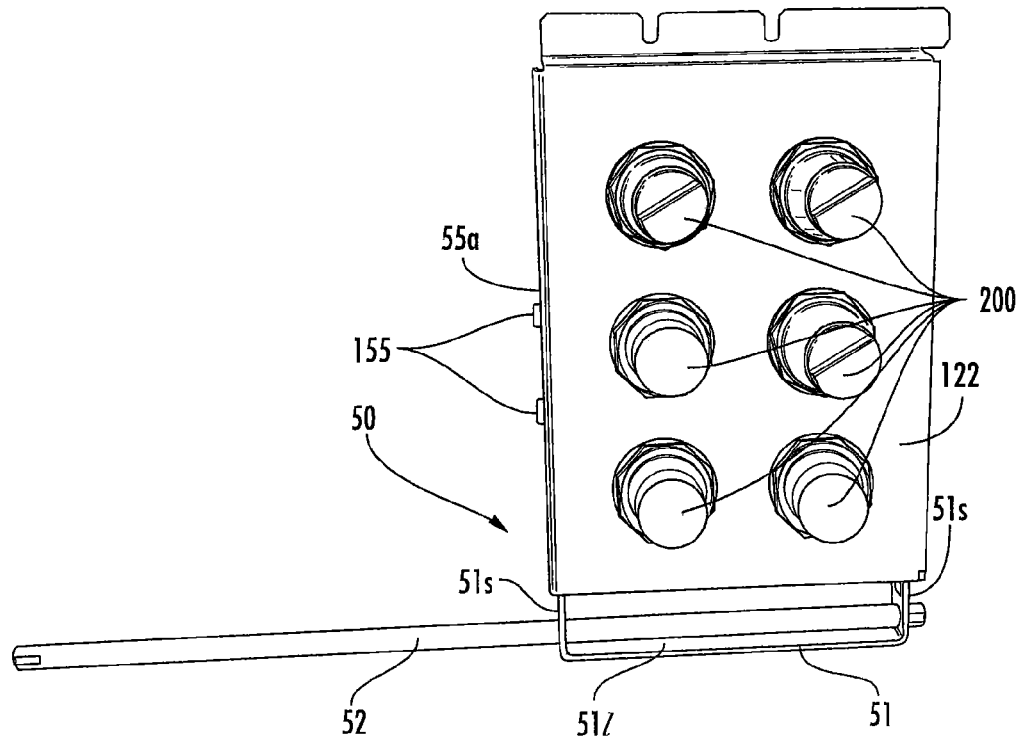
FIG. 16A is a front view of the device panel held by the shaft according to embodiments of the present invention.
Figure 16B:
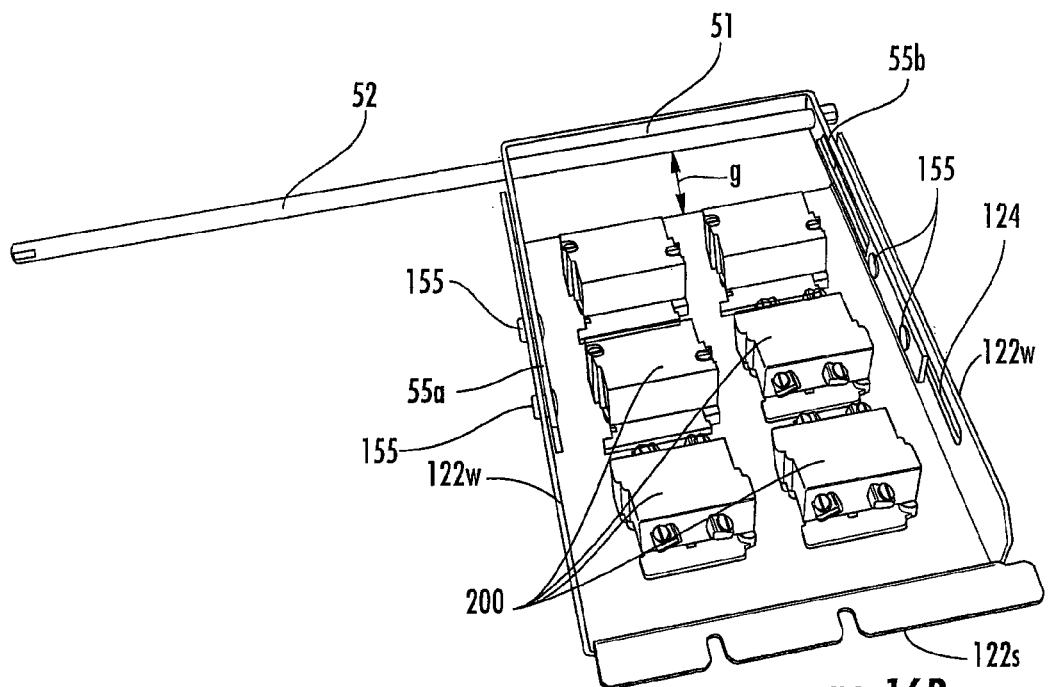
FIG. 16B is a rear perspective view of the device panel shown in FIG. 16A.
Figure 16C:
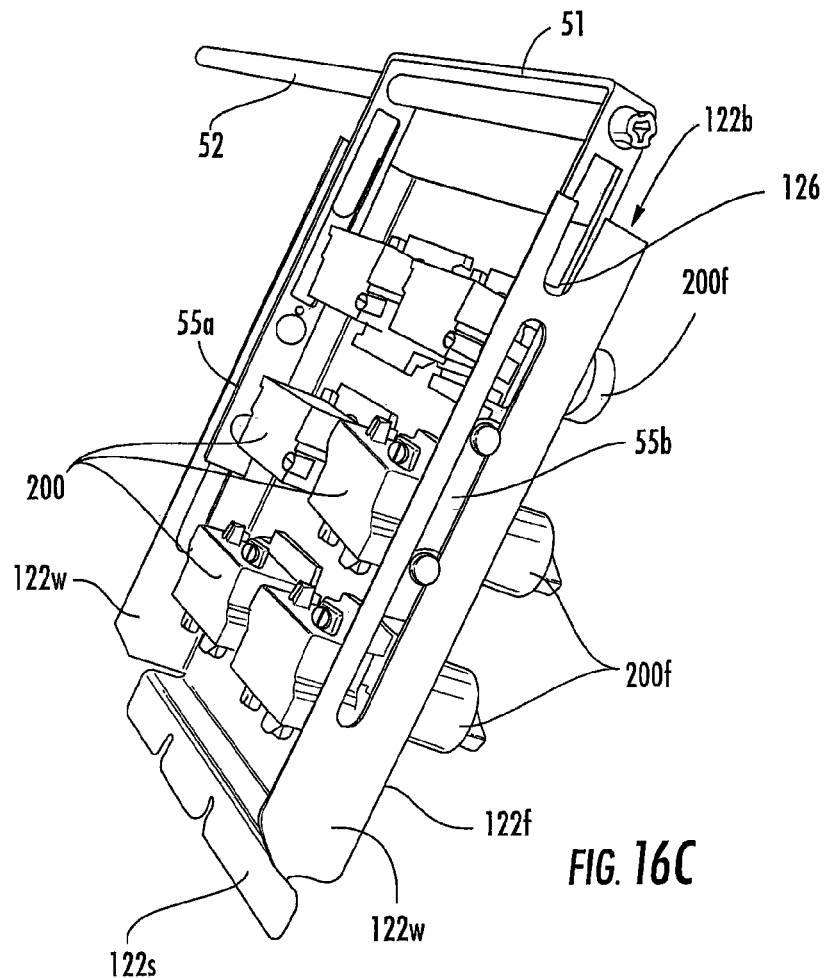
FIG. 16C is a rear perspective view of the device panel shown in FIG. 16A but illustrating the panel slid out away from the shaft a distance further than the position in FIG. 16B according to embodiments of the present invention.
Figure 17:
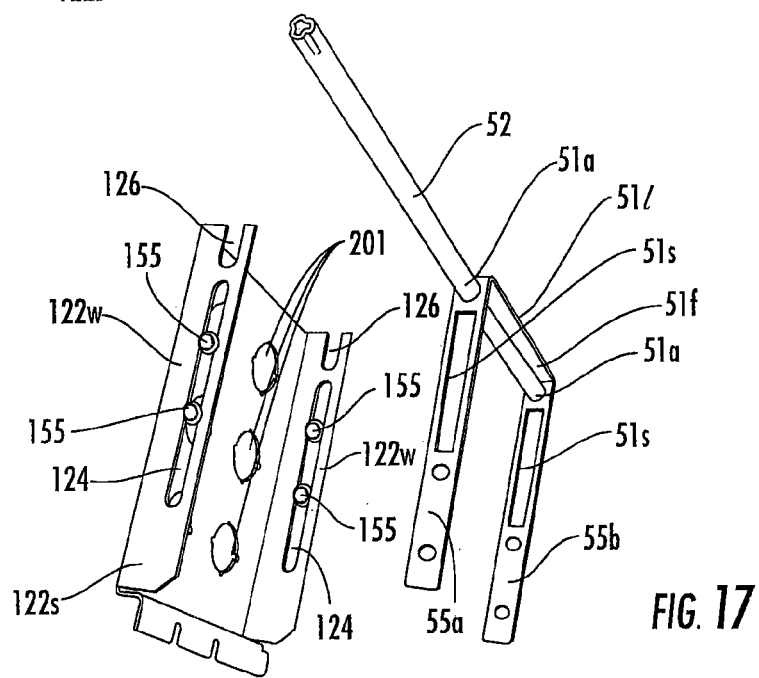
FIG. 17 is a partial exploded view of the panel and hinge assembly according to embodiments of the present invention.

FIGS. 16A-C illustrate an exemplary sub-panel 122s without springs 58 (FIG. 8). FIG. 16C shows an exemplary open position of the sub-panel 122s with the pilot devices have an outer facing end 200f that extend out of the planar front surface 122f of the sub-panel 122s, with the sub-panel 122a pivoted down and slid outward away from the shaft 52 (typically, the panel is slid outward before pivoting or while pivoting down to avoid interference with adjacent units).

FIGS. 18A-21B illustrate an alternate embodiment of the hinge assembly 50. In this embodiment, the arms 55a', 55b' include a guide 55g with a body that is sized and configured to attach to the frame side 51s and extend out of the slot 124 of the panel sidewall 122w. The guide 55g can have a shape that corresponds to the perimeter shape of the slot 124 (with a shorter length), e.g., rectangular as shown. However, other shapes may be used. The guide 55g can be elastomeric and/or polymeric (e.g., plastic) or other material or have a coating that facilitates a suitable slide action.

Figure 20:
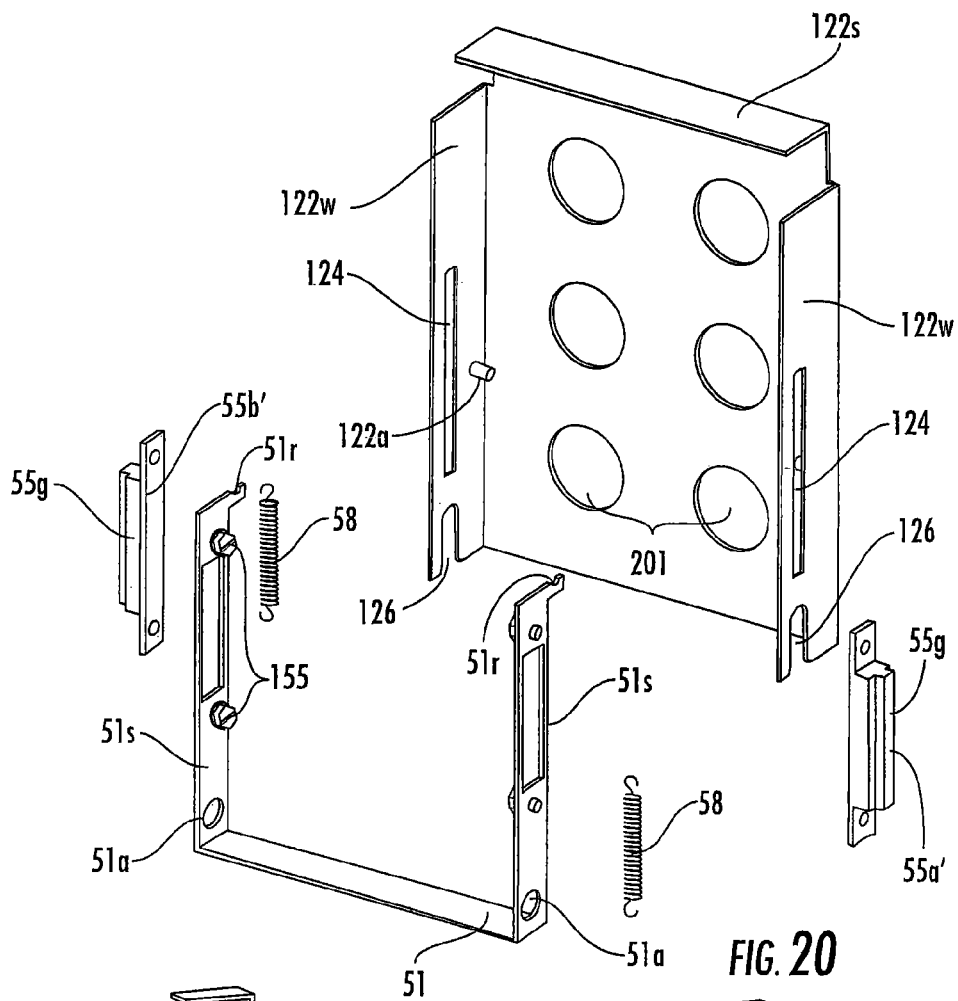
FIG. 20 is a partial exploded view of the panel and hinge assembly shown in FIGS. 18A and 18B according to embodiments of the present invention.
Figure 21A:
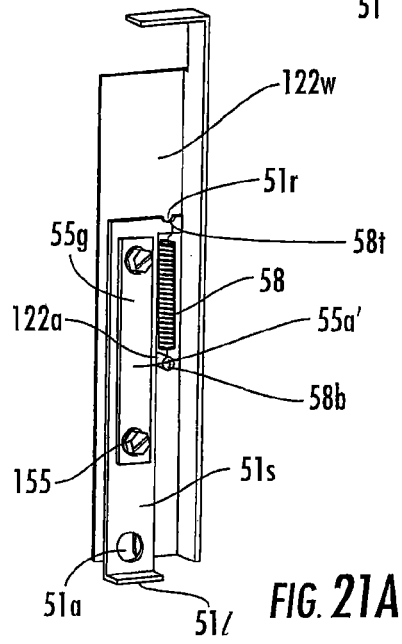
FIGS. 21A and 21B are section views of the side of the panel shown in FIGS. 18A and 18B according to embodiments of the present invention.
Figure 21B:
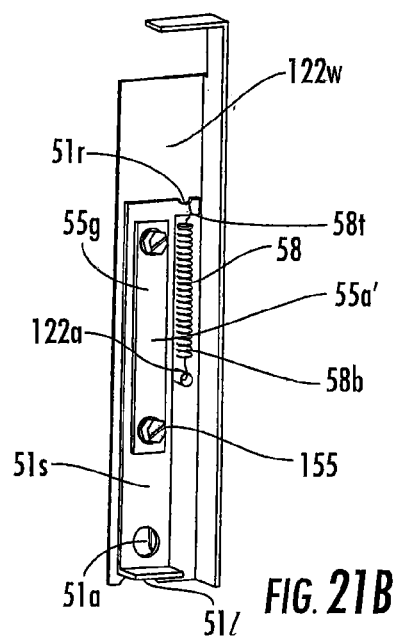

As shown in FIGS. 20, 21A and 21B, the top of the spring 58t can attach to a spring recess 51r on a top of the frame side and a bottom of the spring 58b can attach to an attachment member or surface 122a on the sidewall 122w. However, other arrangements and configurations can be used. In some embodiments, no biasing is required.

The spring-loaded hinge assembly 50 can be configured to bias the swing-down pilot device panel 122s in a latched position so it will remain secured to the bucket 10 even if the access screws are loose—unless there is an independent action to pull the panel down by the user to open the panel 122s.

In some embodiments, the panel 122 or sub-panels 122s can be metal, typically steel, panels (as shown, a left sub-panel for the rotary handle and a right sub-panel for pilot devices). Metal panels 122 or sub-panels 122s can be configured to provide arc-flash mitigation if an event took place while opening the MCC outer door and/or removing a bucket in an energized MCC lineup.

The panel 122 and/or sub-panels 122s can be configured to have enhanced robustness using, for example, metallic panels or sub-panels to inhibit and/or prevent deformation of the doors/panels/sub-panels as well as to inhibit or prevent popping latches during an arc-flash event.

The panel 122 and/or sub-panels 122s can be configured to have flush flat steel panels 122, 122s behind door cutouts which can reduce or minimize fit issues when closing the door—as compared to protruding conventional plastic panels that have to match and fit through associated door cutouts.

In some embodiments, the panel 122 and/or sub-panels 122s can be metallic such as steel that can be in contact with a metallic pivot tube as the shaft 52 which can provide an electrical ground path for exposed metallic areas of pilot devices—as opposed to conventional ungrounded pilot devices that are isolated when mounted on a plastic device panel.

The MCC 100 can be configured so that the MCC has a more robust door 22 made from heavy gauge steel with stronger latches and hinges and an extra end chamber to contain an energy blast to meet conventional short circuit testing of MCC products to these levels of explosive pressure wave inside the MCC.

In some embodiments, the MCC can be configured to be an arc resistant product that can comply with IEEE C37.20.7 guidelines, which do not presently cover MCCs. As is well known to those of skill in the art, the C37.20.7 criteria is to protect someone that is by chance standing by the MCC during an arcing event, but is not directed to users working on the unit or MCC.

The new arc resistant robustness can be facilitated by the use of steel panels 122 and/or sub-panels 122s. Conventional device panel are plastic. The new arc resistant door 22 (FIG. 1) can be formed from 12 gauge (0.093 inches) steel in contrast to conventional 14 gauge (0.067 inches) with a strength that may have a 3X relationship to thickness. The new panels 122, 122s can increase the robustness of the unit door arrangement.

The unit 10 can be configured with a panel and/or sub-panel interlock so that the handle disconnect is in the OFF position before allowing the user to open the panel 122 or sub-panel 122s.

It is also noted that while particularly suitable for units or bucket assemblies 10 of motor control centers, the panels/sub-panels with telescoping hinges may be useful for other housings with circuit breakers and the like.

Figure 26:
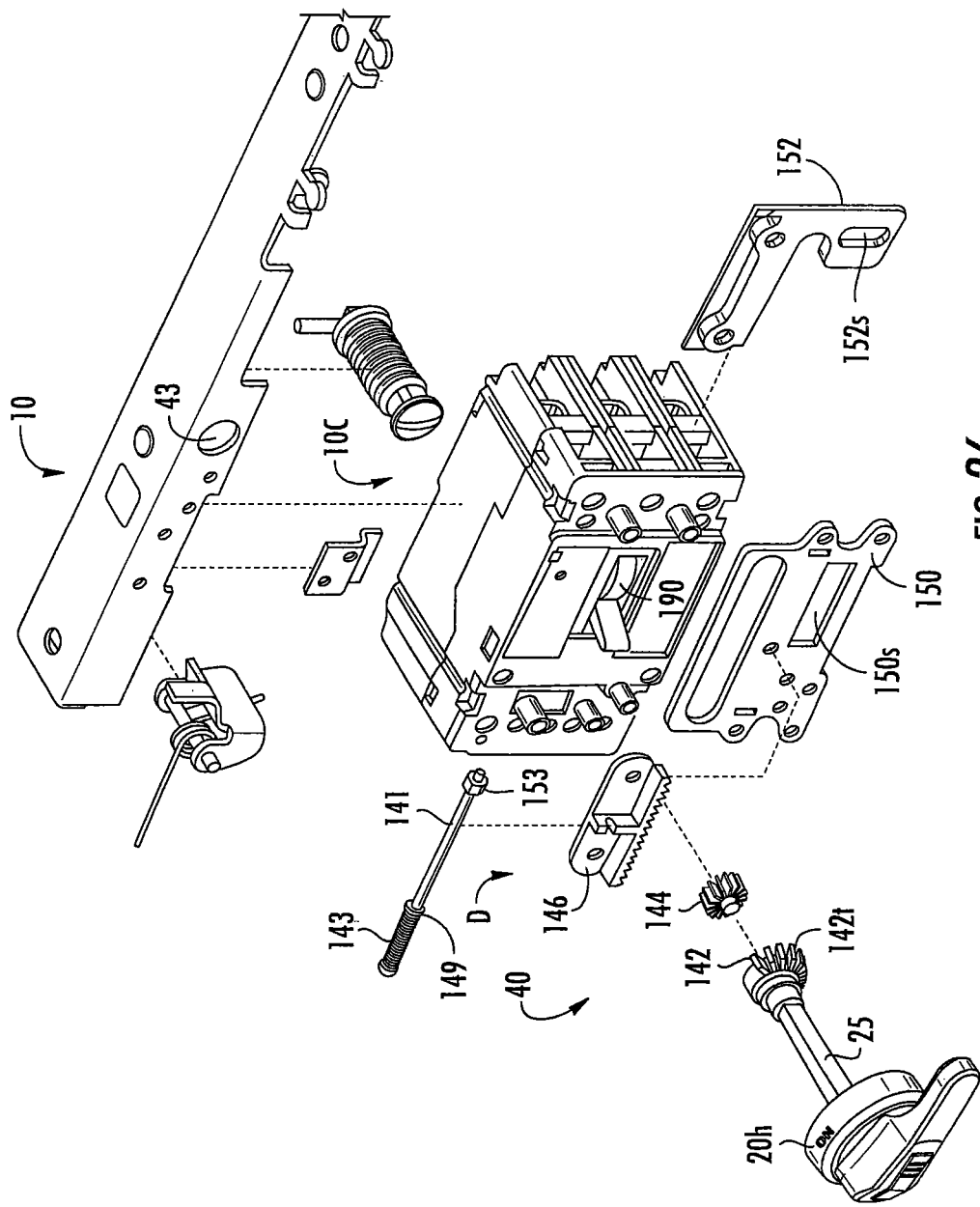
FIG. 26 is a partial exploded view of an exemplary unit illustrating components of an exemplary operator mechanism according to some embodiments of the present invention.

Referring to FIG. 22, in some embodiments, the bucket assembly or unit 10 has a dual feeder and/or starter configuration. The dual feeder and/or starter unit 10 can include respective right and left handles 20h attached to a respective shaft 25 of a corresponding disconnect D such as a disconnect operator mechanism 40 (FIGS. 10, 26). The bucket assembly or unit 10 can be configured for DC (direct current) or AC (alternating current) operation. The bucket assembly 10 can have a metal enclosure, frame or housing 10h with sidewalls 10s.

In some embodiments, the bucket assembly 10 can comprise a molded case circuit breaker 10c. Molded case circuit breakers are well known to those of skill in the art, as exemplified by U.S. Pat. Nos. 4,503,408 and 5,910,760, the contents of which are incorporated herein by reference as if recited in full herein. In other embodiments, the bucket assembly 10 can be configured to house a fused disconnect switch to turn power on and off. In some embodiments, the MCC cabinet 100 (FIG. 1) can hold both a disconnect switch and circuit breaker type units 10 and each can have a standardized rotary handle 20h that controls the internal components for power on/off operation.

FIG. 22, for example, illustrates that the unit 10 has a stab isolating portal 43 residing above the handle operator 20h or handle operators 20h. The unit 10 may have a retractable stab. See, e.g., co-pending, U.S. patent application Ser. No. 14/318,971, now published as US Patent Application Publication Number U.S. 2015/0380910, the contents of which are hereby incorporated by reference as if recited in full herein.

FIGS. 3 and 13 illustrate exemplary respective ON and OFF orientations of the rotary handle 20h. Thus, in operation, the pre-defined orientation of the rotary handle 20h with respect to operation status can provide a visual indication to a user-operator of the conduction status of the disconnect d, e.g., breaker or switch disconnect (optionally with a fuse) being ON/OFF.

The term "ON" with respect to handle position/orientation refers to the associated feeder or starter of the unit 10 having conduction with the operator disconnect closed (circuit breaker closed or fused switch being ON/switch closed). The term "OFF" with respect to handle position/orientation refers to the associated feeder or starter of the unit 10 having no conduction with the disconnect open (circuit breaker open or disconnect switch OFF/switch open).

In some embodiments, if the handle 20h is in a generally horizontal position, i.e., with a center lever 21 (shown as with text of "push to rotate" associated with a pop-out lever) straight across the front of the circuit breaker as shown in FIG. 13, this orientation can be the OFF position and can be visually used as an indication that the contacts of the circuit breaker are open and that current is blocked. If the handle 20h is rotated from the orientation shown in FIG. 13, e.g., rotated 90 degrees (typically clockwise from the orientation in FIG. 13), then an indication is given that the circuit contacts are closed. Where the unit 10 includes a breaker, the breaker trip position can be at about 45 degrees mid-point between ON and OFF. However, as noted above, the handles 20h may have other configurations and are not required to be rotating handles and may use other angular orientations for ON and/or OFF. The embodiment shown in FIG. 13 can be configured to have a "push" to pop out configuration whereby an aperture 20a is exposed to allow a physical lock to be attached to an end of an arm of the lever 21 of the handle 20h. For further description of this exemplary handle configuration, see, U.S. patent application Ser. No. 14/524,585, now published as US 2015/0221459, the contents of which are hereby incorporated by reference as if recited in full herein.

FIG. 22 illustrates that the unit 10 can have at least one laterally slidable shutter 75 with a portal. When the portal is aligned with the isolation portal 43, external access to the portal 43 is allowed. When the portal of the shutter is left or right of the portal 43, the shutter body resides over and blocks the portal 43. The shutter 75 can reside behind a panel 76 with an aperture 43a aligned with the access portal 43. FIG. 22 also illustrates that the unit 10 can have a FLASH-GARD interlock L typically via the top surface of the unit.

Figure 23:
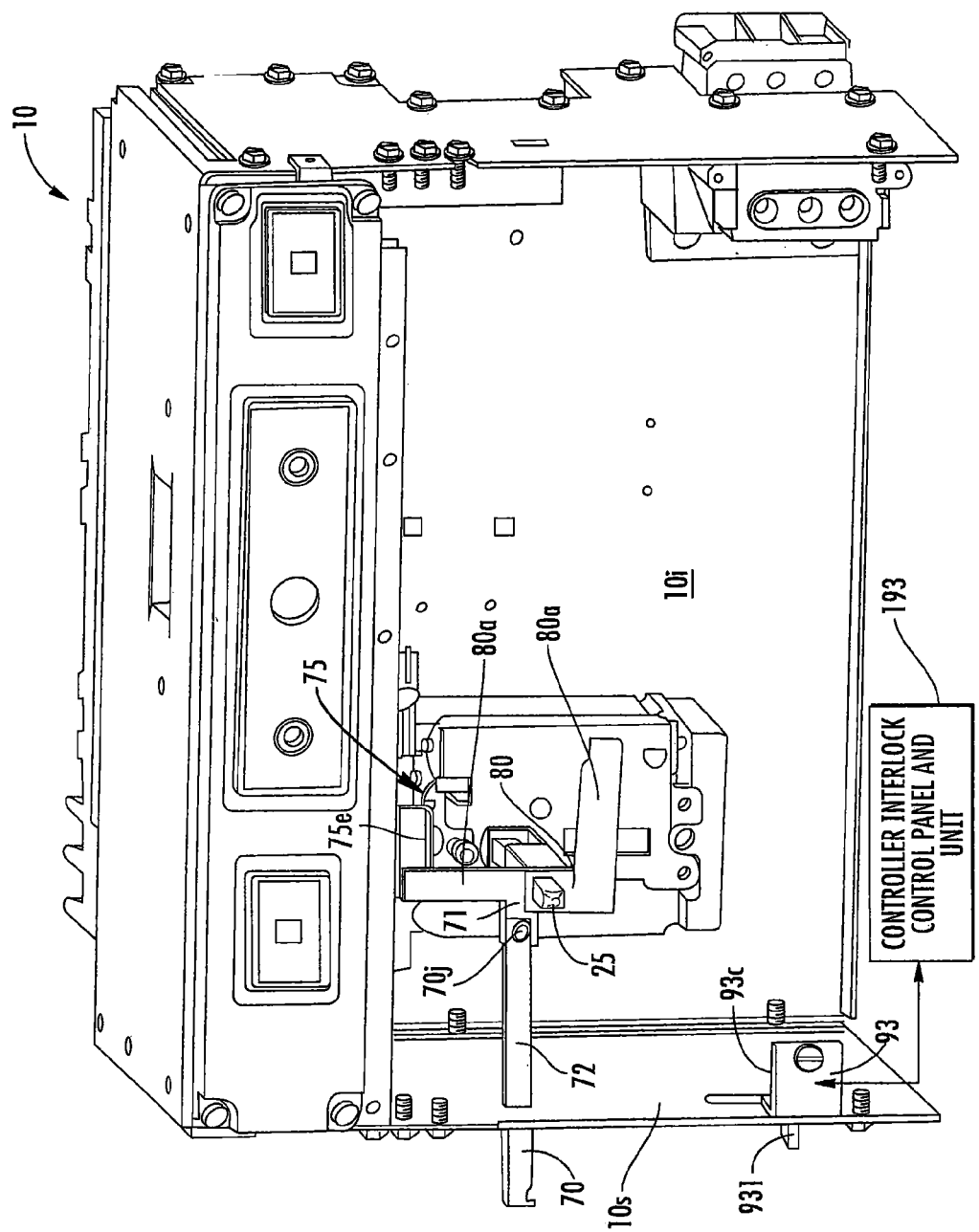
FIG. 23 illustrates that the bucket/unit and a unit interlock which engages the front hinged panel and which is controlled by a controller for interlock control according to embodiments of the present invention.

As shown by FIGS. 22 and 23, for example, the operator handle 20h can be attached to an inwardly extending shaft 25. The shaft 25 can hold the interlock linkage 70 and at least one cam 80. The shaft 25 can be part of the operator disconnect mechanism D, 40 (FIG. 19, for example). Each of the right and left side cams 80 can be configured to move the at least one shutter 75 both right to left and left to right.

In some embodiments, the cam 80 can reside closer the front of the unit 10, e.g., closer to the handle 20h than the linkage 70. The cam 80 can have a plurality of radially-outwardly extending, circumferentially spaced apart arms 80a ("circumferentially" is used broadly to describe spacing about the shaft 25, recognizing that the shaft 25 may have a non-circular shape), at least one of which pushes the at least one shutter 75 to slide left and at least a different other at least one pushes the at least one shutter 75 to slide right. The cam 80 may have a curvilinear cam profile, e.g., with a curvature configured with outer lobes and a valley(s) rather than or in addition to the straight arms 80a to control movement of the at least one shutter 75 (not shown).

In some embodiments, the angular spacing between the cam arms 80a on a respective shaft 25 can be between about 45-135 degrees, typically about 90 degrees. In some embodiments, the arms 80a are orthogonal to each other as shown in FIG. 23. The angular spacing can substantially correspond with the angular spacing between ON and OFF for a respective handle 20h orientation.

The shutter 75 can have a lower portion 75e that can contact the cam 80 when the handle 20h is in the defined positions to move into the appropriate aligned position: (i) with the shutter portal aligned with the portal 43 to open the access portal 43 or a misaligned position and (ii) with the shutter portal laterally offset from the portal 43 to block portal 43 access.

The lower portion 75e can be referred to as a "cam follower". The cam follower 75e moves linearly and is not required to always be in contact with the cam 80. In some embodiments, the cam 80 is configured so that in the ON position, one arm contacts the cam follower 75e and in the OFF position, the other arm contacts the cam follower. The cam follower 75e may extend outwardly away from a plane associated with the shutter primary body, typically horizontally. The cam follower may extend substantially horizontally toward the front of the unit 10 or substantially horizontally toward the rear of the unit 10 and may have a different configuration. The cam follower 75e can comprise a horizontally extending protrusion or ledge that can provide assembly tolerance so as to be able to consistently engage the drive portion of a respective cam 80 held on the shaft 25 despite build tolerances. The lateral stroke distance of the shutter 75 and/or lower portion of the shutter 75e in each direction, right to left and/or left to right to open/close the access path to the portal 43 can be between about 0.25 inches to about 3 inches, more typically between about 1 inch to about 2 inches.

The cam 80 can be provided as a monolithic single piece body or may be provided as discrete closely spaced components held by the shaft 25 in a proper orientation to cause the respective sliding left and right lateral movement of the shutter 75.

The interlock linkage 70 can pivotably attached to a short outwardly extending link 71 via joint 70j with the link 71 being shorter than the lever arm 72 of the linkage 70 (FIG. 23) and is typically shorter than the cam arms 80a. The linkage 70 is typically fully extended (horizontal or substantially horizontal) in the ON position to extend out of the sidewall 10s and is retracted so as to be pivoted downward or upward in the OFF position.

In some embodiments, a monolithic shaped (typically rigid metal) member can define both the short link 71 and at least one of the cam arms 80a as shown in FIG. 18, for example.

The unit 10 can be configured with an interlock that ensures that the unit disconnect D (e.g., breaker) is OPEN before allowing the unit stabs S (FIG. 25) to be racked in or out, and when the disconnect D (breaker) is closed, the interlock is configured so that the stabs S must remain closed. The racking system can be configured as a slow break contact arrangement and is not typically designed to breaker the electrical current.

As shown in FIG. 23, for example, the unit or bucket 10 can optionally be configured to engage one or more unit interlocks 93. The unit interlock 93 can be in communication with an electronic controller 193 that controls the release or the interlock 93. The interlock 93 may include an automated clamp or latch 93c that holds the lower end of the panel 122 or sub-panels 122s, and may include a latch 931 that extends out of the sidewall 10s to prevent the panel(s) from pivoting when the interlock is engaged.

As shown in FIG. 26, the unit 10 can include a disconnect D such as a molded case circuit breaker (MCCB) or disconnect switch, one or both of which can be operated by an internal operating handle mechanism 40 commonly called the "op-mech" or "operator mechanism" or "disconnect operator". The disconnect switch can include an integrated fuse or may be connected to a fuse, in some embodiments. This op-mech 40 can be configured to mount over the lever 190, e.g., a breaker's integral lever and/or an ON/OFF switch lever of disconnect switch. The op-inch 40 allows a user to operate the circuit breaker 10C or switch with the door 22 of the motor control center unit 10 closed. The door 22 and/or handle 20h itself can include visual indicia I (FIGS. 3, 4, 13), e.g., text and/or color, that identifies an operational status by position, e.g., Reset "R", OFF, TRIPPED and ON. The TRIPPED indicia may be omitted for fuse systems. It is noted that for ease of discussion, the dual feeders are used by way of example. However, a respective feeder can be replaced with a starter and any unit 10 can include two starter circuits, two feeder circuits or a starter and a feeder, for example.

For a circuit breaker configuration, the handle 20h can move between circuit breaker conduction to circuit breaker non-conduction. Where a rotating handle is used, typically, there is about a 90° rotation from conduction to non-conduction ("OFF" to "ON") but other defined rotational stroke distances may be used including, for example, about 45 degrees, about 120 degrees, or about 180 degrees. For a fused disconnect, a similar rotation can be used to cause the ON/OFF.

As shown in FIG. 26, for example, the operator mechanism 40 can include a drive gear 142, a pinion gear 144, and an operator rack gear 146. Generally summarized, the handle 20h via shaft 25 is keyed to interface with the rotary drive gear 142. Drive gear 142 interacts mechanically with pinion gear 144. Pinion gear 144 also interacts with the linearly translating moveable rack 146. Consequently, as the handle 20h rotates, because it is interlocked with the drive gear 142, the drive gear 142 rotates on its axis, thus rotating the pinion gear 144, which then linearly moves the rack 146: The rack 146 then moves the operator slider 152 over operator base 150 which moves to trip lever 190 as the handle 20h moves. The operator base 150 can be stationary and affixed to an inner housing. The base 150 can have a horizontally oriented elongate slot 150s that is aligned with a smaller slot 152s in the operator slider 152. The slots 150s, 152s cooperate to hold lever 190 (toggle) and when the operator slider with slot 152s moves to the right (based on rotation of the handle 20h, for example), this moves the lever 190 to the right along the path defined by slot 150s. It is noted that the lever 190 (also known as a toggle) can move laterally as shown or the circuit breaker or fuse switch may be oriented to move vertically.

The base 150 and cooperating slider 152 can be provided in different sizes with different length and width slots 150s to accommodate smaller and larger toggles or switches associated with frames of different sizes/amperage rating.

For fused switch disconnects, the gear 142 in communication with a rack gear 146 may optionally be configured to move up and down or orthogonal to the rack gear 146. This movement can engage and move a fuse switch lever or input, up and down for ON/OFF operation. Exemplary fuses are FUSETRON™ 600V Class RK5 fuses (BU-SB 13729) available from Cooper Bussmann Company, St. Louis, Mo. However, the design is flexible and can accommodate other fuses including those in different classes.

Referring again to FIG. 26, for units 10 with circuit breakers 10C, the operating mechanism 40 can also include a trip assist spring 143 that is in communication with the rack gear 146 to assist the handle 20h to move to a consistent OFF position when the circuit breaker is tripped. For additional description of an example of an operator mechanism and components thereof, see, e.g., For additional description of an example of an operator mechanism and components thereof for fused disconnects, see, e.g., U.S. application Ser. No. 14/501,969, now published as US 2015/0103472, the contents of which are hereby incorporated by reference as if recited in full herein.

Figure 27:
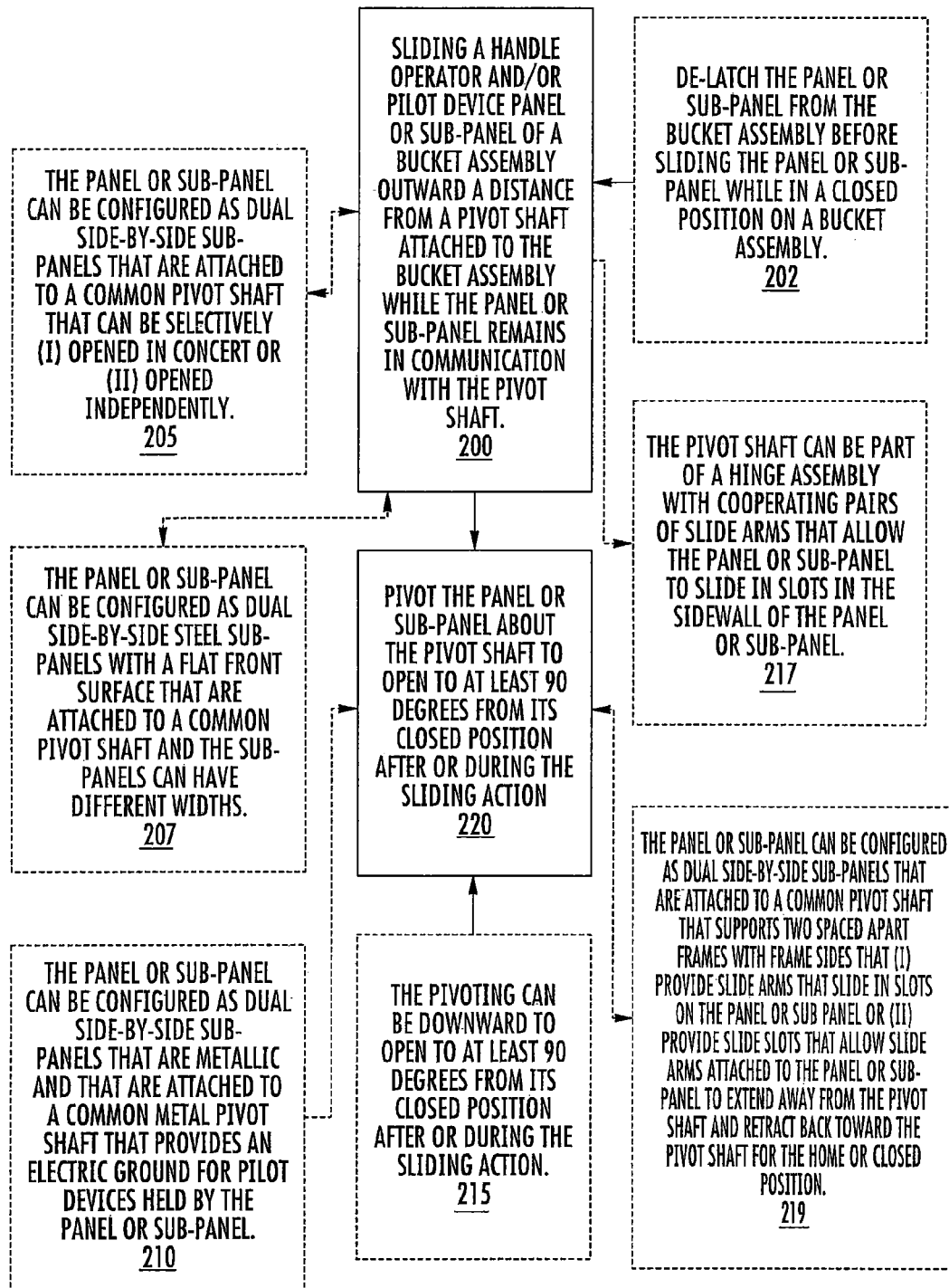
FIG. 27 is a flow chart of operations that can be used to open a panel or sub-panel of a bucket assembly (e.g., "bucket" or "unit") according to embodiments of the present invention.

FIG. 27 illustrates exemplary operational steps that can be used to open a panel of a bucket. As shown, a handle operator and/or pilot device panel or sub-panel of a bucket assembly can be slid outward a distance from a pivot shaft attached to the bucket assembly while the panel or sub-panel remains in communication with the pivot shaft (block 200). The panel or sub-panel can be pivoted (rotated) about the pivot shaft to open to at least 90 degrees from its closed position after or during the sliding action (block 220).

The panel or sub-panel can be de-latched from the bucket assembly before sliding the panel or sub-panel while in a closed position on a bucket assembly (block 202).

The panel or sub-panel can be configured as dual side-by-side sub-panels that are attached to a common pivot shaft that can be selectively (i) opened in concert or (ii) opened independently (block 205).

The panel or sub-panel can be configured as dual side-by-side steel sub-panels with a flat front surface that are attached to a common pivot shaft and the sub-panels can have different widths (block 207).

The panel or sub-panel can be configured as dual side-by-side sub-panels that are metallic and that are attached to a common metal pivot shaft that provides an electric ground for pilot devices held by the panel or sub-panel (block 210).

The pivoting can be downward to open to at least 90 degrees from its closed position after or during the sliding action (block 215).

The pivot shaft can be part of a hinge assembly with cooperating pairs of slide arms that allow the panel or sub-panel to slide in slots in the sidewall of the panel or sub-panel (block 217).

The panel or sub-panel can be configured as dual side-by-side sub-panels that are attached to a common pivot shaft that supports two spaced apart frames with frame sides that cooperate with sides of respective sub-panels to (i) provide slide arms that slide in slots on the panel or side panel or (ii) provide slots that allow slide arms attached to sides of sub-panels to travel, to extend and retract each sub-panel (block 219) so that the panel/sub-panel can slidingly extend away from the pivot shaft and retract back toward the pivot shaft for the home or closed position.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. A bucket assembly, comprising:
   a unit housing holding at least one of a disconnect or a circuit breaker;
   at least one laterally extending shaft attached to the unit housing;
   a support member attached to the at least one laterally extending shaft and comprising right and left side arms; and
   a panel or at least one sub-panel attached to the support member, wherein the panel or the at least one sub-panel comprises a front wall with at least one outwardly facing handle of an operator mechanism and/or outwardly facing pilot devices, wherein the front wall merges into laterally spaced apart right and left sidewalls of the panel or the at least one sub-panel that are perpendicular to the front wall and parallel to the right and left side arms of the support member,
   wherein the panel or the at least one sub-panel moves between open and closed positions, wherein, in the closed position, the panel or the at least one sub-panel is vertically oriented, and wherein the panel or the at least one sub-panel pivots from the closed position to the open position about the at least one laterally extending shaft and the right and left sidewalls of the panel or the at least one sub-panel slide outward away from the at least one laterally extending shaft.

2. The bucket assembly of claim 1, wherein the right and left sidewalls of the panel or the at least one sub-panel each comprise at least one elongate slot that reside a distance above the at least one laterally extending shaft and the at least one laterally extending shaft slidably engages at least one open slot in the right and left side arms, respectively.

3. The bucket assembly of claim 1, wherein the right and left side arms of the support member are longitudinally fixed in position to remain at a fixed distance from the at least one laterally extending shaft.

4. The bucket assembly of claim 3, wherein the right and left side arms are laterally spaced apart to reside adjacent laterally opposing ends of the front wall of the panel or the at least one sub-panel and are shorter than the right and left sidewalls of the panel or the at least one sub-panel.

5. The bucket assembly of claim 1, wherein the panel or the at least one sub-panel comprises the at least one sub-panel with the pilot devices and the sub-panel is metallic, and wherein the at least one sub-panel is in abutting contact with the laterally extending shaft when in the closed position to define an electrical ground.

6. The bucket assembly of claim 1, wherein the at least one laterally extending shaft and the panel or the at least one sub-panel are metallic, and wherein the panel or the at least one sub-panel is in abutting contact with the laterally extending shaft when in the closed position to define an electrical ground.

7. The bucket assembly of claim 1, wherein a bottom of each of the right and left sidewalls of the panel or a bottom of each of the right and left sidewalls of the at least one sub-panel comprise a slot with an open end facing the shaft, wherein, in the closed position, the shaft resides in the slot with the open end of the bottom of the panel or the at least one sub-panel, and wherein in the open position, the shaft resides outside the slot with the open end of the bottom of the panel or the at least one sub-panel.

8. The bucket assembly of claim 7, wherein the slot with the open end of the bottom of the panel or the at least one sub-panel has an arcuate upper end with a radius of curvature corresponding to a radius of the at least one laterally extending shaft.

9. The bucket assembly of claim 1, wherein the at least one laterally extending shaft is a single shaft that resides along a bottom portion of the unit housing and is attached to opposing, laterally spaced apart unit housing sidewalls.

10. The bucket assembly of claim 1, wherein the support member comprises a laterally extending segment that resides below the at least one laterally extending shaft and has laterally opposing ends that turn orthogonally upward to merge into the right and left side arms adjacent the right and left sidewalls, and wherein the support member comprises right and left side apertures holding the at least one laterally extending shaft.

11. The bucket assembly of claim 1, further comprising:
    a right side spring attached to the right sidewall of the panel or the at least one sub-panel and the right side arm; and
    a left spring attached to the left sidewall of the panel or the at least one sub-panel and the left side arm.

12. The bucket assembly of claim 1, wherein the panel or the at least one sub-panel is side-by-side dual sub-panels that are releasably attached along inner facing adjacent sides to be able to pivot outward together or separately, and wherein the side-by-side dual sub-panels engage at least one unit interlock attached to the unit housing to controllably lock and unlock the side-by-side dual sub-panels to allow the side-by-side dual sub-panels to open from the unit housing only when there is non-conduction of electric current through at least one stab of the bucket assembly.

13. A motor control center (MCC) comprising the bucket assembly of claim 1, wherein the at least one laterally extending shaft and the panel or the at least one sub-panel are metallic.

14. A Motor Control Center (MCC) comprising an enclosure with at least first and second compartments, the first compartment residing above the second compartment, wherein the MCC comprises a bucket assembly removably disposed in the first or second compartment,
    the bucket assembly, comprising:
       a unit housing;
       a laterally extending shaft attached to the unit housing;
       a support member attached to the laterally extending shaft and comprising right and left side arms; and
       a panel or at least one sub-panel attached to the support member, the panel or the at least one sub-panel comprising at least one outwardly facing handle of an operator mechanism and/or a plurality of outwardly facing pilot devices, wherein the panel or the at least one sub-panel includes a front wall that merges into laterally spaced apart inwardly extending right and left sidewalls that are perpendicular to the front wall and that are also parallel to the right and left side arms of the support member, wherein the right and left sidewalls of the front wall each comprise upper and lower slots, the lower slot comprising a closed upper end with an arcuate shape and a longitudinally spaced apart open lower end facing the laterally extending shaft,
    wherein the panel or the at least one sub-panel moves between open and closed positions, wherein, in the closed position, the panel or the at least one subpanel is vertically oriented, wherein the panel or the at least one sub-panel pivots open about the laterally extending shaft from the closed position to the open position and the right and left sidewalls of the front wall of the panel or the at least one sub-panel slides outward away from the at least one laterally extending shaft held by the right and left side arms of the support member, wherein the laterally extending shaft and the panel or the at least one sub-panel are metallic, and wherein, in the closed position, the laterally extending shaft abuts the panel or the at least one sub-panel to define an electrical ground path.

15. The MCC of claim 14, wherein the upper slot in the right and left sidewalls of the panel or the at least one sub-panel aligns at least partially with at least one slot in the right side arm and the left side arm.

16. The MCC of claim 14, wherein the right and left side arms of the support member are longitudinally fixed in position to remain at a fixed distance from the laterally extending shaft.

17. The MCC of claim 14, wherein the support member with the right and left side arms spans across a width dimension of the panel or the at least one sub-panel under the open lower end of the right and left sidewalls of the front wall of the panel or the at least one sub-panel, wherein the right and left side arms are attached to the right and left sidewalls, respectively, of the panel or the at least one sub panel and are shorter than the right and left sidewalls of the panel or the at least one sub-panel.

18. The MCC of claim 14, wherein, in the open position, the laterally extending shaft resides outside the lower slot in the right and left sidewalls.

19. The MCC of claim 14, wherein the arcuate shape of the upper end of the lower slot has a radius of curvature corresponding to an outer radius of the laterally extending shaft.

20. A bucket assembly for a motor control center (MCC) comprising:

a unit housing;

a laterally extending shaft attached to the unit housing;

a support member attached to the laterally extending shaft and comprising right and left side arms; and a panel or at least one sub-panel attached to the support member, the panel or the at least one sub-panel comprising at least one outwardly facing handle of an operator mechanism and/or a plurality of outwardly facing pilot devices, wherein the panel or the at least one sub-panel includes a front wall that merges into laterally spaced apart inwardly extending right and left sidewalls that are perpendicular to the front wall and that are also parallel to the right and left side arms of the support member, wherein the right and left sidewalls of the front wall each comprise upper and lower slots, the lower slot comprising a closed upper end with an arcuate shape and a longitudinally spaced apart open lower end facing the laterally extending shaft, wherein the panel or the at least one sub-panel moves between open and closed positions, wherein, in the closed position, the panel or the at least one sub-panel is vertically oriented, wherein the panel or the at least one sub-panel pivots open about the laterally extending shaft from the closed position to the open position and the right and left sidewalls of the front wall of the panel or the at least one sub-panel slides outward away from the at least one laterally extending shaft held by the right and left side arms of the support member, wherein the laterally extending shaft and the panel or the at least one sub-panel are metallic, and wherein, in the closed position, the laterally extending shaft abuts the panel or the at least one sub-panel to define an electrical ground path.

* * * * *

UNITED STATES PATENT AND TRADEMARK OFFICE
CERTIFICATE OF CORRECTION

PATENT NO. : 9,888,589 B2
APPLICATION NO. : 15/240723
DATED : February 6, 2018
INVENTOR(S) : Oneufer et al.

Page 1 of 1

It is certified that error appears in the above-identified patent and that said Letters Patent is hereby corrected as shown below:

In the Specification

Column 7, Line 29: Please correct "10″″" to read -- 10′″ --

Column 17, Line 4: Please correct "931" to read -- 93*l* --

Signed and Sealed this
Twenty-second Day of May, 2018

Andrei Iancu
*Director of the United States Patent and Trademark Office*